United States Patent
Pyon

(10) Patent No.: US 12,219,816 B2
(45) Date of Patent: Feb. 4, 2025

(54) ORGANIC LIGHT EMITTING DIODE DISPLAY DEVICE

(71) Applicant: SAMSUNG DISPLAY CO., LTD., Yongin-si (KR)

(72) Inventor: Chang Soo Pyon, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/361,810

(22) Filed: Jul. 28, 2023

(65) Prior Publication Data

US 2023/0389361 A1 Nov. 30, 2023

Related U.S. Application Data

(60) Continuation of application No. 16/453,390, filed on Jun. 26, 2019, now Pat. No. 11,765,938, which is a
(Continued)

(30) Foreign Application Priority Data

Oct. 27, 2014 (KR) .................. 10-2014-0146468

(51) Int. Cl.
*H10K 59/121* (2023.01)
*H01L 27/12* (2006.01)
*H10K 59/131* (2023.01)

(52) U.S. Cl.
CPC ..... *H10K 59/1216* (2023.02); *H01L 27/1222* (2013.01); *H01L 27/1225* (2013.01);
(Continued)

(58) Field of Classification Search
CPC .......... H10K 59/1216; H10K 59/1213; H10K 59/131; H10K 59/123; H01L 27/1222; H01L 27/1225; H01L 27/124
(Continued)

(56) References Cited

U.S. PATENT DOCUMENTS 6,358,672 B2  3/2002  Jeoung et al.
6,398,430 B1  6/2002  Jeoung et al.
(Continued)

FOREIGN PATENT DOCUMENTS

CN  1530773 A  9/2004
CN  1855198 A  11/2006
(Continued)

OTHER PUBLICATIONS

U.S. Office Action dated Feb. 26, 2024, issued in U.S. Appl. No. 18/146,980 (14 pages).
(Continued)

*Primary Examiner* — Nduka E Ojeh
*Assistant Examiner* — Laura M Dykes
(74) *Attorney, Agent, or Firm* — Lewis Roca Rothgerber Christie LLP

(57) ABSTRACT

An organic light emitting diode display device includes: a substrate; a scan line configured to transfer a scan signal; a data line and a driving voltage line configured to transfer a data voltage and a driving voltage, respectively; a switching transistor including a switching drain electrode configured to output the data voltage; a driving transistor including a driving gate electrode connected with the switching drain electrode; a storage capacitor including a first storage electrode connected with the driving gate electrode and a second storage electrode connected with the driving voltage line; and an organic light emitting diode connected with a driving drain electrode of the driving transistor. The storage capacitor includes: a connector in which an edge of the second storage electrode is offset from an edge of the first storage electrode in a direction toward the center of the second storage electrode, and a storage compensator facing the connector.

16 Claims, 14 Drawing Sheets

Related U.S. Application Data division of application No. 14/857,690, filed on Sep. 17, 2015, now Pat. No. 10,388,712.

(52) U.S. Cl.
CPC ....... *H01L 27/124* (2013.01); *H10K 59/1213* (2023.02); *H10K 59/131* (2023.02)

(58) Field of Classification Search
USPC .......................................................... 257/40
See application file for complete search history.

(56) References Cited

U.S. PATENT DOCUMENTS

| | | |
|---|---|---|
| 7,196,466 B2 | 3/2007 | Hieda et al. |
| 7,352,442 B2 | 4/2008 | Iriguchi |
| 7,561,128 B2 | 7/2009 | Ahn et al. |
| 7,652,291 B2 | 1/2010 | Koo et al. |
| 7,847,292 B2 | 12/2010 | Koo et al. |
| 8,289,235 B2 | 10/2012 | Matsumoto et al. |
| 8,546,807 B2 | 10/2013 | Werne et al. |
| 8,692,749 B2 | 4/2014 | Matsumoto et al. |
| 8,866,706 B2 | 10/2014 | Kang et al. |
| 8,922,467 B2 | 12/2014 | Matsumoto et al. |
| 9,111,893 B2 | 8/2015 | Ebisuno et al. |
| 9,349,782 B2 | 5/2016 | Hong |
| 9,412,800 B2 | 8/2016 | Kim |
| 9,478,586 B2 | 10/2016 | Lee |
| 9,502,488 B2 | 11/2016 | Hwang et al. |
| 9,673,267 B2 | 6/2017 | Kim et al. |
| 10,014,359 B2 | 7/2018 | Kim et al. |
| 10,084,029 B2 | 9/2018 | Lee |
| 10,546,906 B2 | 1/2020 | Lee |
| 10,923,545 B2 | 2/2021 | Lee |
| 11,574,969 B2 | 2/2023 | Lee |
| 11,818,921 B2 | 11/2023 | Lee |
| 2003/0222589 A1 | 12/2003 | Osame et al. |
| 2004/0256997 A1 | 12/2004 | Fukumoto et al. |
| 2005/0052124 A1 | 3/2005 | Hieda et al. |
| 2005/0093789 A1 | 5/2005 | Kim et al. |
| 2005/0243039 A1 | 11/2005 | Kwak |
| 2006/0023551 A1 | 2/2006 | Peng et al. |
| 2006/0267491 A1 | 11/2006 | Koo et al. |
| 2007/0085782 A1 | 4/2007 | Matsumoto et al. |
| 2007/0159077 A1 | 7/2007 | Kim |
| 2007/0164939 A1 | 7/2007 | Miyazaki |
| 2007/0273630 A1 | 11/2007 | Lee |
| 2008/0308797 A1 | 12/2008 | Akimoto et al. |
| 2010/0079695 A1 | 4/2010 | Um et al. |
| 2012/0001885 A1 | 1/2012 | Kang et al. |
| 2014/0034923 A1 | 2/2014 | Kim et al. |
| 2014/0077176 A1 | 3/2014 | Lee et al. |
| 2014/0077180 A1 | 3/2014 | Moon |
| 2014/0117328 A1* | 5/2014 | Hur .................... H01L 27/1255 257/40 |
| 2015/0053953 A1 | 2/2015 | Ebisuno et al. |
| 2015/0243722 A1 | 8/2015 | Kwon et al. |
| 2016/0079331 A1 | 3/2016 | Hwang et al. |
| 2016/0141558 A1 | 5/2016 | Cha et al. |
| 2016/0211273 A1* | 7/2016 | Moon .................... H10K 59/12 |
| 2024/0040854 A1 | 2/2024 | Lee |

FOREIGN PATENT DOCUMENTS

| | | |
|---|---|---|
| CN | 1892773 A | 1/2007 |
| CN | 1975847 A | 6/2007 |
| CN | 101051132 A | 10/2007 |
| CN | 101078846 A | 11/2007 |
| CN | 101083068 A | 12/2007 |
| CN | 101114099 A | 1/2008 |
| CN | 101183185 A | 5/2008 |
| CN | 101359692 A | 2/2009 |
| CN | 102054832 A | 5/2011 |
| CN | 102622985 A | 8/2012 |
| CN | 103489889 A | 1/2014 |
| CN | 104078486 A | 10/2014 |
| EP | 1860639 A1 | 11/2007 |
| JP | 6-295997 | 10/1994 |
| JP | 10-79439 | 3/1998 |
| JP | 2001-109395 A | 4/2001 |
| KR | 10-2005-0021888 A | 3/2005 |
| KR | 10-0600878 | 7/2006 |
| KR | 10-0623253 | 9/2006 |
| KR | 10-2006-0123004 A | 12/2006 |
| KR | 10-2006-0134582 A | 12/2006 |
| KR | 10-2007-0042878 A | 4/2007 |
| KR | 10-0739649 | 7/2007 |
| KR | 10-2008-0022447 | 3/2008 |
| KR | 10-2012-0003536 A | 1/2012 |
| KR | 10-2012-0104816 A | 9/2012 |
| KR | 10-2013-0139059 A | 12/2013 |
| KR | 10-2014-0018623 | 2/2014 |
| KR | 10-2014-0037715 | 3/2014 |
| KR | 10-2014-0037715 A | 3/2014 |
| KR | 10-2014-0117041 A | 10/2014 |
| KR | 10-2014-0118010 A | 10/2014 |
| RU | 2499326 C2 | 11/2013 |
| TW | 394980 B | 6/2000 |
| WO | WO 2013/171938 A1 | 11/2013 |

OTHER PUBLICATIONS

Chinese Office action issued in application No. CN 201910856109.8, dated Sep. 22, 2021, 10 pages.

Chinese Office action issued in application No. CH 201810856510.1, dated Oct. 11, 2021, 11 pages.

U.S. Office Action dated Oct. 21, 2015, issued in U.S. Appl. No. 14/316,887 (8 pages).

U.S. Notice of Allowance dated Jul. 20, 2016, issued in U.S. Appl. No. 14/686,704 (9 pages).

U.S. Notice of Allowance dated Jun. 25, 2024, issued in U.S. Appl. No. 18/146,980 (9 pages).

* cited by examiner

ORGANIC LIGHT EMITTING DIODE DISPLAY DEVICE

CROSS-REFERENCE TO RELATED APPLICATIONS

This application is a continuation of U.S. patent application Ser. No. 16/453,390, filed Jun. 26, 2019, now U.S. Pat. No. 11,765,938, which is a divisional of U.S. patent application Ser. No. 14/857,690, filed Sep. 17, 2015, now U.S. Pat. No. 10,388,712, which claims priority to and the benefit of Korean Patent Application No. 10-2014-0146468 filed in the Korean Intellectual Property Office on Oct. 27, 2014, the entire contents of all of which are incorporated herein by reference.

BACKGROUND

1. Field

The present invention relates to an organic light emitting diode display device.

2. Description of the Related Art

An organic light emitting diode includes two electrodes and an organic emission layer positioned therebetween. The organic light emitting diode emits light when electrons injected from one electrode and holes injected from the other electrode are coupled with each other in the organic emission layer to form excitons, and the excitons discharge energy.

An organic light emitting diode display device includes a plurality of pixels including the organic light emitting diode which is a self-emission element, and in each pixel, a plurality of transistors for driving the organic light emitting diode and one or more capacitors are formed. The plurality of transistors basically includes a switching transistor and a driving transistor.

A wire pattern of the organic light emitting diode display device may be formed by using a photolithography process. A plurality of lenses of an exposure scanner used in an exposure process which is a part of the photolithography process may overlap with each other at ends thereof, and an exposure amount may be uneven at an overlapping section of the lenses. In this case, the wire pattern may be displaced (e.g., moved by a predetermined distance) from the position (e.g., the predetermined position) of the wire pattern to be formed, and an overlay change in which an overlapping distance from wires formed therebelow or thereon may occur. According to the overlay change, the storage capacitance may be changed, and as a result, a current flowing in the pixel is nonuniform and spots may be generated.

The above information disclosed in this Background section is only for enhancement of understanding of the background of the invention and therefore it may contain information that does not form the prior art already known in this country to a person of ordinary skill in the art.

SUMMARY

Aspects of the present invention provide an organic light emitting diode display device that can reduce (or prevent) spots due to an overlay change.

An exemplary embodiment of the present disclosure provides an organic light emitting diode display device, including: a substrate; a scan line on the substrate and configured to transfer a scan signal; a data line and a driving voltage line crossing the scan line and configured to transfer a data voltage and a driving voltage, respectively; a switching transistor connected with the scan line and the data line and including a switching drain electrode configured to output the data voltage; a driving transistor including a driving gate electrode connected with the switching drain electrode; a storage capacitor including a first storage electrode connected with the driving gate electrode and a second storage electrode connected with the driving voltage line; and an organic light emitting diode electrically connected with a driving drain electrode of the driving transistor. The storage capacitor includes: a connector in which an edge of the second storage electrode is offset from an edge of the first storage electrode in a direction toward the center of the second storage electrode, and a storage compensator facing the connector.

The storage capacitor may further include a main portion in which the edge of the second storage electrode is apart from the edge of the first storage electrode by a main margin width to be offset from the edge of the first storage electrode in a direction away from the center of the second storage electrode, and in the storage compensator, the edge of the second storage electrode may be apart from the edge of the first storage electrode by a compensation margin width to be offset from the edge of the first storage electrode in a direction toward the center of the second storage electrode.

The main margin width may be a sum of a process margin of the edge of the first storage electrode and a process margin of the edge of the second storage electrode.

The compensation margin width may have a range from a width smaller than 1% of the main margin width to the same width as the main margin width.

The storage compensator may include a first corner cut portion of the first storage electrode and a second corner cut portion of the second storage electrode.

The second corner cut portion may be apart from the first corner cut portion by the compensation margin width to be offset from the first corner cut portion in a direction toward the center of the second storage electrode.

The storage compensator may face the connector on a diagonal line.

The storage compensator may include a first corner of the first storage electrode and a second corner of the second storage electrode.

The second corner may be apart from the first corner by the compensation margin width to be offset from the first corner in a direction toward the center of the second storage electrode.

The storage compensator may include a first side of the first storage electrode and a second side of the second storage electrode.

The second side may be apart from the first side by the compensation margin width to be offset from the first side in a direction toward the center of the second storage electrode.

The connector may include a third corner of the first storage electrode and a third corner cut portion of the second storage electrode.

The organic light emitting diode display device may further include: a semiconductor on the substrate and including a switching channel of the switching transistor and a driving channel of the driving transistor which are apart from each other, and the driving channel may overlap with the driving gate electrode.

The first storage electrode may correspond to the driving gate electrode, and the second storage electrode may be on the same layer as the data line and the driving voltage line.

The driving channel may have at least one curved portion.

The organic light emitting diode display device may further include: a compensation transistor including a compensation gate electrode which is a part of the scan line, and a compensation source electrode and a compensation drain electrode in the semiconductor; and a first data connector on the same layer as the data line and connecting the first storage electrode and the compensation drain electrode.

The first data connector may be connected with the third corner of the first storage electrode.

The driving voltage line may include a first driving voltage line parallel with the data line and a second driving voltage line crossing the data line, and the first driving voltage line may be on the same layer as the data line, and the second driving voltage line may be on the same layer as the scan line.

According to the exemplary embodiment of the present disclosure, by forming the storage compensation unit positioned in the storage capacitor to face the connection unit, when the first storage electrode or the second storage electrode is formed, even though an overlay change occurs due to nonuniformity of an exposure amount, the storage capacitance may be maintained substantially the same as before.

Further, the second storage electrode is formed on the same layer with the same material as the driving voltage line and the data line, and as a result, at least one mask may be reduced to manufacture the organic light emitting diode display device.

DETAILED DESCRIPTION

Figure 1:
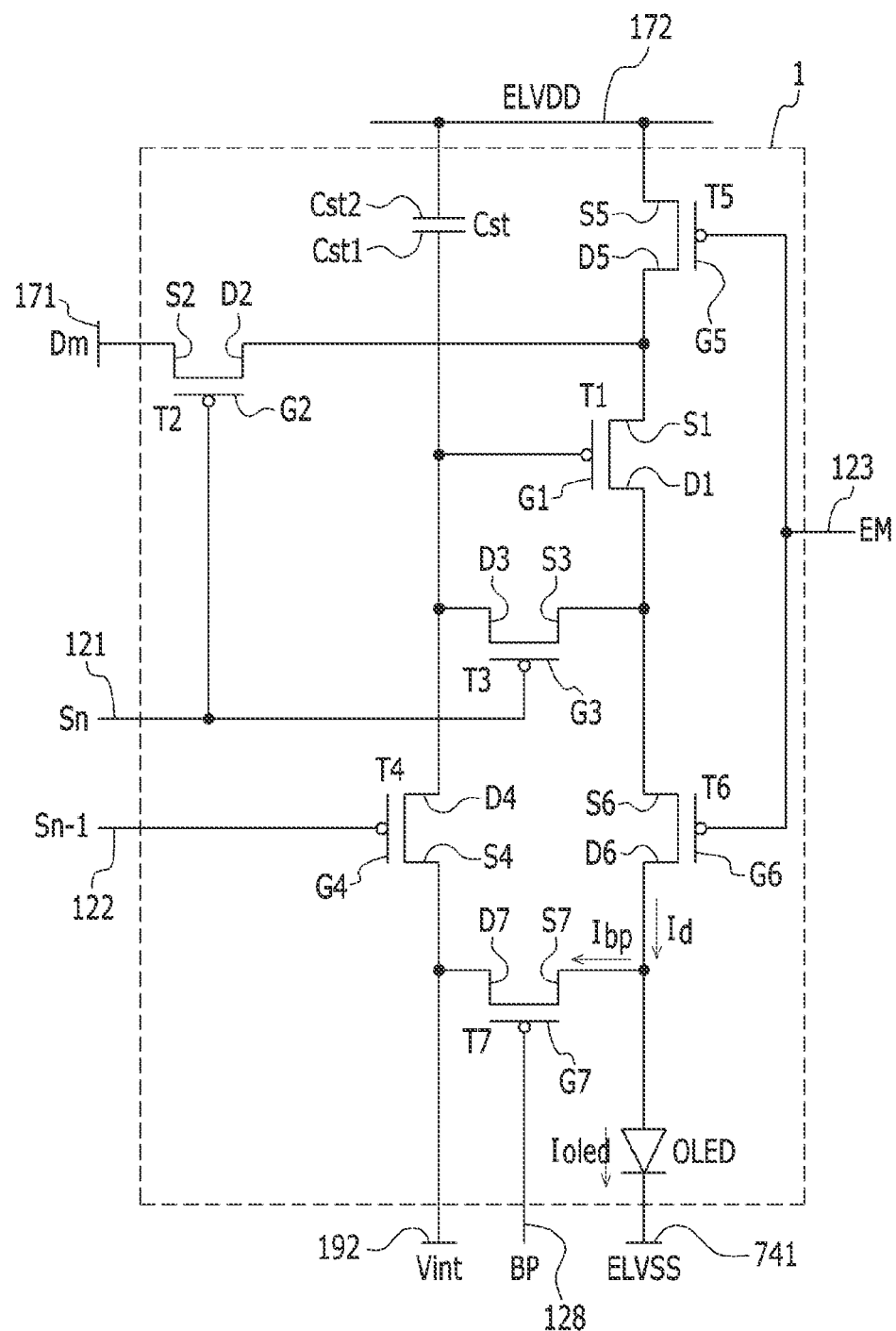
FIG. 1 is an equivalent circuit diagram of one pixel of an organic light emitting diode display device according to an example embodiment of the present invention.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes and thicknesses of elements, layers, films, panels, and regions may be exaggerated for clarity. Accordingly, the drawings and description are to be regarded as illustrative in nature and not restrictive.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," "coupled to," or "connected with" another element or layer, it can be directly on, connected to, coupled to, or connected with the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

It will be understood that when an element or layer is referred to as being "on," "connected to," or "coupled to" another element or layer, it can be directly on, connected to, or coupled to the other element or layer, or one or more intervening elements or layers may be present. Further, throughout the specification, the word "on" may mean positioning on or below the object portion, but does not essentially mean positioning on the upper side of the object portion based on a gravity direction. In addition, it will also be understood that when an element or layer is referred to as being "between" two elements or layers, it can be the only element or layer between the two elements or layers, or one or more intervening elements or layers may also be present.

Further, throughout the specification, the word "on a plane" means viewing a target portion from the top, and the word "on a cross section" means viewing a cross section formed by vertically cutting a target portion from the side.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

The organic light emitting diode display device and/or any other relevant devices or components according to embodiments of the present invention described herein may be implemented utilizing any suitable hardware, firmware (e.g. an application-specific integrated circuit), software, or a suitable combination of software, firmware, and hardware. For example, the various components of the organic light emitting diode display device may be formed on one integrated circuit (IC) chip or on separate IC chips. Further, the various components of the organic light emitting diode display device may be implemented on a flexible printed circuit film, a tape carrier package (TCP), a printed circuit board (PCB), and/or formed on a same substrate. Further, the various components of the organic light emitting diode display device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

Next, an organic light emitting diode display device according to an example embodiment of the present invention will be described in detail with reference to FIGS. 1 to 8.

FIG. 1 is an equivalent circuit diagram of one pixel of an organic light emitting diode display device according to an example embodiment of the present invention.

As illustrated in FIG. 1, one pixel 1 of the organic light emitting diode display device according to an example embodiment of the present invention includes a plurality of signal lines 121, 122, 123, 128, 171, 172, and 192, a plurality of transistors T1, T2, T3, T4, T5, T6, and T7 connected to the plurality of signal lines, a storage capacitor Cst, and an organic light emitting diode OLED.

The transistors T1, T2, T3, T4, T5, T6, and T7 include a driving transistor T1, a switching transistor T2, a compensation transistor T3, an initialization transistor T4, an operation control transistor T5, a light emission control transistor T6, and a bypass transistor T7.

The signal lines 121, 122, 123, 128, 171, 172, and 192 include a scan line 121 for transferring a scan signal Sn, a previous scan line 122 for transferring a previous scan signal Sn−1 to the initialization transistor T4, a light emission control line 123 for transferring a light emission control signal EM to the operation control transistor T5 and the light emission control transistor T6, a bypass control line 128 for transferring a bypass signal BP to the bypass transistor T7, a data line 171 crossing the scan line 121 and being for transferring a data signal Dm, a driving voltage line 172 for transferring a driving voltage ELVDD and formed to be substantially parallel with the data line 171, and an initialization voltage line 192 for transferring an initialization voltage Vint for initializing the driving transistor T1.

A gate electrode G1 of the driving transistor T1 is connected with one end Cst1 of the storage capacitor Cst, a source electrode S1 of the driving transistor T1 is connected with the driving voltage line 172 via the operation control transistor T5, a drain electrode D1 of the driving transistor T1 is electrically connected with an anode of the organic light emitting diode OLED via the light emission control transistor T6. The driving transistor T1 receives the data signal Dm according to a switching operation of the switching transistor T2 to supply a driving current Id to the organic light emitting diode OLED.

A gate electrode G2 of the switching transistor T2 is connected with the scan line 121, a source electrode S2 of the switching transistor T2 is connected with the data line 171, and a drain electrode D2 of the switching transistor T2 is connected with the source electrode S1 of the driving transistor T1 and connected with the driving voltage line 172 via the operation control transistor T5. The switching transistor T2 is turned on according to the scan signal Sn received through the scan line 121 to perform a switching operation of transferring the data signal Dm transferred to the data line 171 to the source electrode of the driving transistor T1.

A gate electrode G3 of the compensation transistor T3 is connected with the scan line 121, a source electrode S3 of the compensation transistor T3 is connected with the drain electrode D1 of the driving transistor T1 and connected with an anode of the organic light emitting diode OLED via the light emission control transistor T6, and a drain electrode D3 of the compensation transistor T3 is connected together with the drain electrode D4 of the initialization transistor T4, one end Cst1 of the storage capacitor Cst, and the gate electrode G1 of the driving transistor T1. The compensation transistor T3 is turned on according to the scan signal Sn received through the scan line 121 to connect the gate electrode G1 and the drain electrode D1 of the driving transistor T1 and diode-connect the driving transistor T1.

A gate electrode G4 of the initialization transistor T4 is connected with the previous scan line 122, a source electrode S4 of the initialization transistor T4 is connected with the initialization voltage line 192, and a drain electrode D4 of the initialization transistor T4 is connected together with one end Cst1 of the storage capacitor Cst and the gate electrode G1 of the driving transistor T1 and the drain electrode D3 of the compensation transistor T3. The initialization transistor T4 is turned on according to the previous scan signal Sn-1 received through the previous scan line 122 to transfer the initialization voltage Vint to the gate electrode G1 of the driving transistor T1 and then perform an initialization operation initializing a gate voltage of the gate electrode G1 of the driving transistor T1.

A gate electrode G5 of the operation control transistor T5 is connected with the light emission control line 123, a source electrode S5 of the operation control transistor T5 is connected with the driving voltage line 172, and a drain electrode D5 of the operation control transistor T5 is connected with the source electrode S1 of the driving transistor T1 and the drain electrode S2 of the switching transistor T2.

A gate electrode G6 of the light emission control transistor T6 is connected with the light emission control line 123, a source electrode S6 of the light emission control transistor T6 is connected with the drain electrode D1 of the driving transistor T1 and the source electrode S3 of the compensation transistor T3, and a drain electrode D6 of the light emission control transistor T6 is electrically connected with an anode of the organic light emitting diode OLED. The operation control transistor T5 and the light emission control transistor T6 are concurrently (e.g., simultaneously) turned on according to the light emission control signal EM received through the light emission control line 123, and as a result, the driving voltage ELVDD is compensated through the diode-connected driving transistor T1 to be transferred to the organic light emitting diode OLED.

A gate electrode G7 of the bypass transistor T7 is connected with the bypass control line 128, a source electrode S7 of the bypass transistor T7 is connected together with the drain electrode D6 of the light emission control transistor T6 and the anode of the organic light emitting diode OLED, and a drain electrode D7 of the bypass transistor T7 is connected together with the initialization voltage line 192 and the source electrode S4 of the initialization transistor T4.

The other end Cst2 of the storage capacitor Cst is connected with the driving voltage line 172, and a cathode of the organic light emitting diode OLED is connected with a common voltage line 741 transferring a common voltage ELVSS.

Hereinafter, a detailed operation process of one pixel of the organic light emitting diode display device according to an example embodiment of the present invention will be described in detail with reference to FIG. 2.

Figure 2:
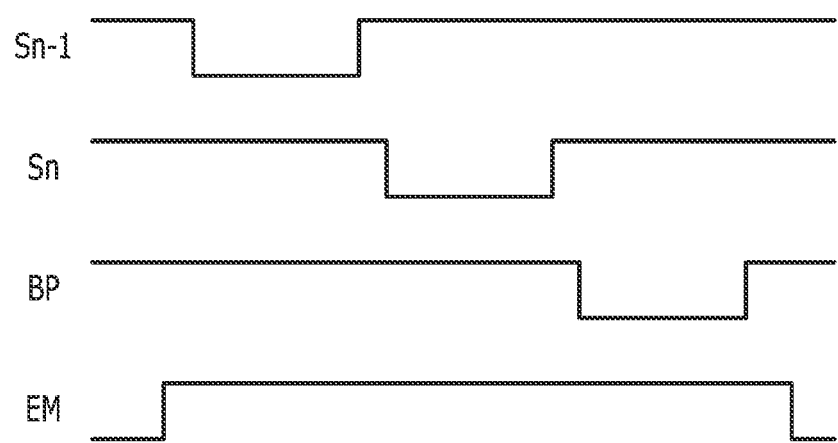
FIG. 2 is a timing diagram of a signal applied to one pixel in the organic light emitting diode display device according to an example embodiment of the present invention.

FIG. 2 is a timing diagram of a signal applied to one pixel in the organic light emitting diode display device according to an example embodiment of the present invention.

As illustrated in FIG. 2, first, for an initialization period, the previous scan signal Sn-1 at a low level is supplied through the previous scan line 122. In this case, the light emission control signal EM at a high level is already applied through the light emission control line 123. Then, the initialization transistor T4 is turned on in response to the previous scan signal Sn-1 at the low level, the initialization voltage Vint is connected from the initialization voltage line 192 to the gate electrode G1 of the driving transistor T1 through the initialization transistor T4, and the driving transistor T1 is initialized by the initialization voltage Vint.

Thereafter, for a data programming period, the scan signal Sn at the low level is supplied through the scan line 121. Then, the switching transistor T2 and the compensation transistor T3 are turned on in response to the scan signal Sn at the low level. In this case, the driving transistor T1 is diode-connected by the turned-on compensation transistor T3 and biased in a forward direction.

Then, a compensation voltage Dm+Vth (Vth has a negative (−) value) reduced from the data signal Dm supplied from the data line 171 by a threshold voltage Vth of the driving transistor T1 is applied to the gate electrode G1 of the driving transistor T1. The driving voltage ELVDD and the compensation voltage Dm+Vth are applied to respective ends of the storage capacitor Cst, and a charge corresponding to a voltage difference between the two ends is stored in the storage capacitor Cst.

Thereafter, for the emission period, the light emission control signal EM supplied from the light emission control line 123 is changed from the high level to the low level. Then, for the emission period, the operation control transistor T5 and the light emission control transistor T6 are turned on by the light emission control signal EM at the low level.

Then, a driving current Id is generated according to a voltage difference between the gate voltage of the gate electrode G1 of the driving transistor T1 and the driving voltage ELVDD, and the driving current Id is supplied to the organic light emitting diode OLED through the light emission control transistor T6. For a light emission period, a gate-source voltage Vgs of the driving transistor T1 is maintained at '(Dm+Vth)−ELVDD' by the storage capacitor Cst, and according to a current-voltage relationship of the driving transistor T1, the driving current Id is proportional to the square of a value obtained by subtracting the threshold voltage from the source-gate voltage, or (Dm−ELVDD)2. Accordingly, the driving current Id is determined regardless of the threshold voltage Vth of the driving transistor T1.

In one embodiment, the bypass transistor T7 receives the bypass signal BP from the bypass control line 128. Thus a part of the driving current Id flows out through the bypass transistor T7 as a bypass current Ibp.

Even in the case where a minimum current of the driving transistor T1 for displaying a black image flows as the driving current, when the organic light emitting diode OLED emits light, the black image may not be displayed well. Accordingly, the bypass transistor T7 of the organic light emitting diode display device according to an example embodiment of the present invention may distribute a part of the minimum current of the driving transistor T1 as the bypass current Ibp to another current path other than the current path of the organic light emitting diode side. Here, the minimum current of the driving transistor T1 refers to a current under a condition in which the driving transistor T1 is turned off because the gate-source voltage Vgs of the driving transistor T1 is smaller than the threshold voltage Vth. The minimum driving current (for example, a current of 10 pA or less) under the condition in which the driving transistor T1 is turned off is transferred to the organic light emitting diode OLED to be expressed as an image with black luminance. When the minimum driving current for expressing the black image flows, an influence on a bypass transfer of the bypass current Ibp may be large, but when a large driving current for expressing an image such as a normal image or a white image flows, there may be little influence on the bypass current Ibp. Accordingly, when the driving current for displaying a black image flows, the light emission current Ioled of the organic light emitting diode OLED which is reduced by the current amount of the bypass current Ibp which flows out from the driving current Id through the bypass transistor T7 has a minimum current amount as a level which may more exactly express the black image. Therefore, a black luminance image may be more exactly implemented by using the bypass transistor T7, thereby improving a contrast ratio. In FIG. 2, the bypass signal BP is substantially the same as a next scan signal Sn+1, but is not necessarily limited thereto. Further, in an example embodiment of the present invention, a structure having 7 transistors including the bypass transistor T7 and one capacitor is illustrated, but the present invention is not limited thereto, and the number of transistors and the number of capacitors may be variously modified.

Next, a detailed structure of the pixel of the organic light emitting diode display device illustrated in FIG. 1 will be described in detail with reference to FIGS. 3 to 9 together with FIG. 1.

Figure 3:
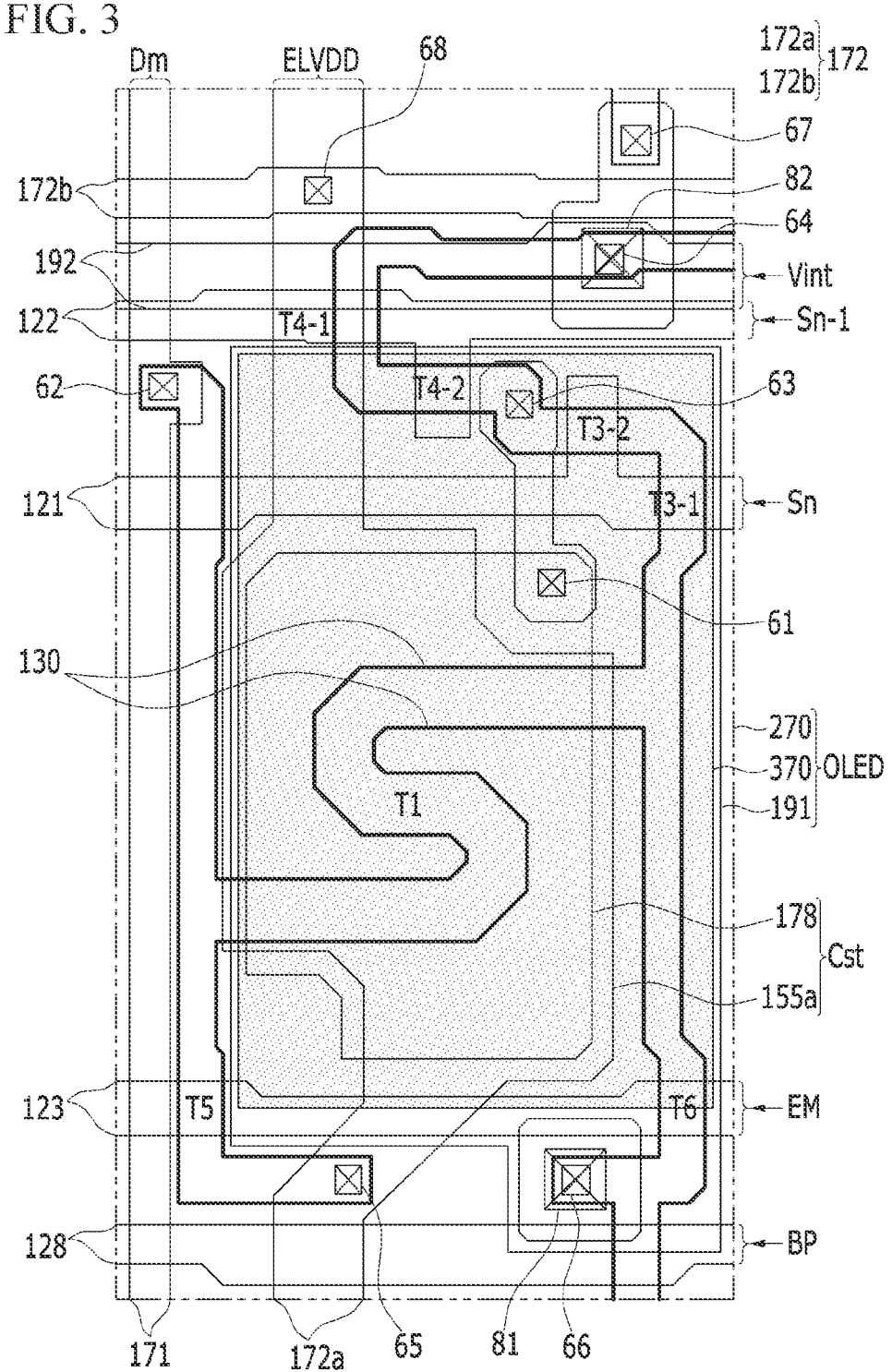
FIG. 3 is a diagram schematically illustrating a plurality of transistors and capacitors in the organic light emitting diode display device according to an example embodiment of the present invention.
Figure 4:
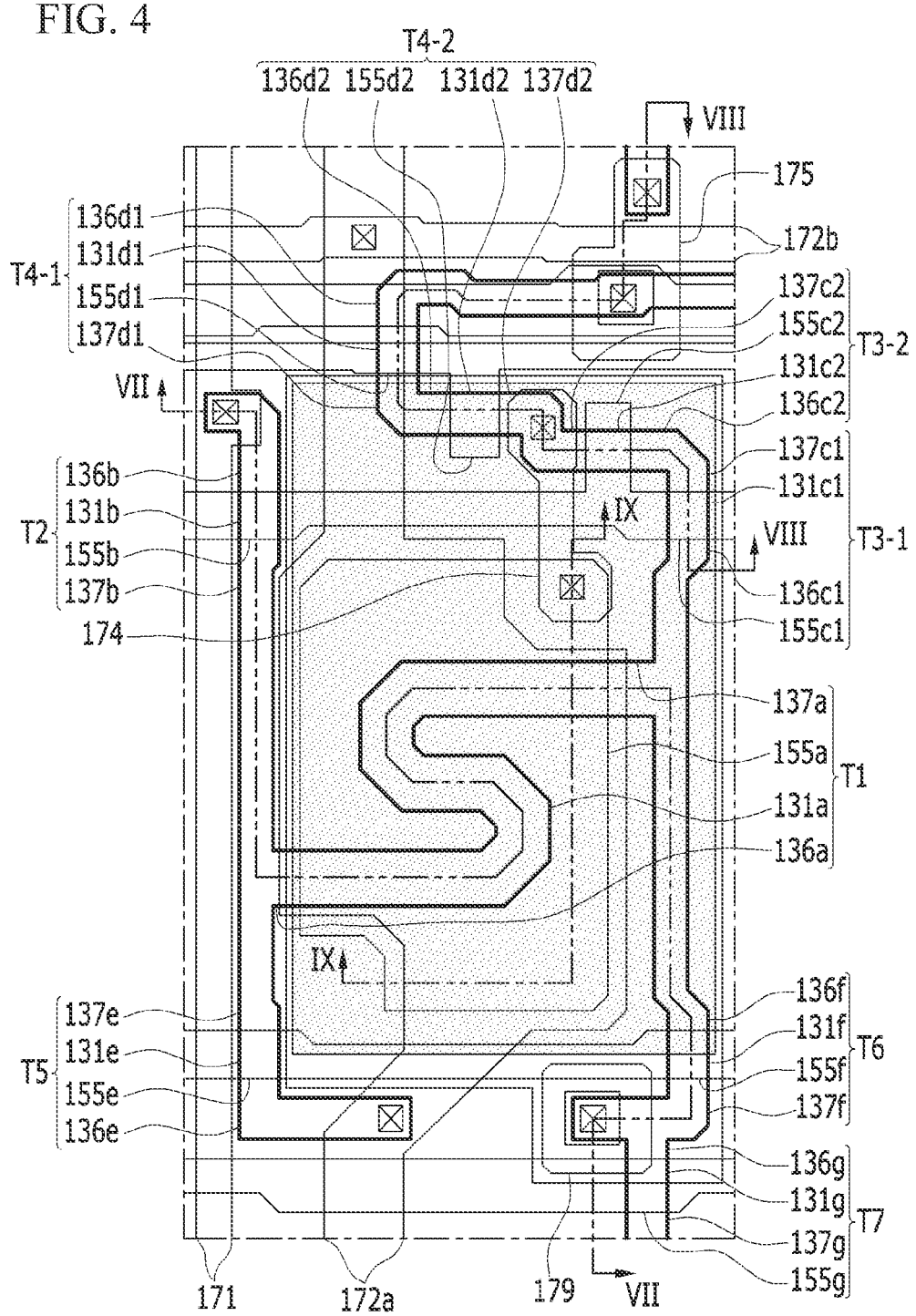
FIG. 4 is a detailed layout view of FIG. 3.
Figure 5:
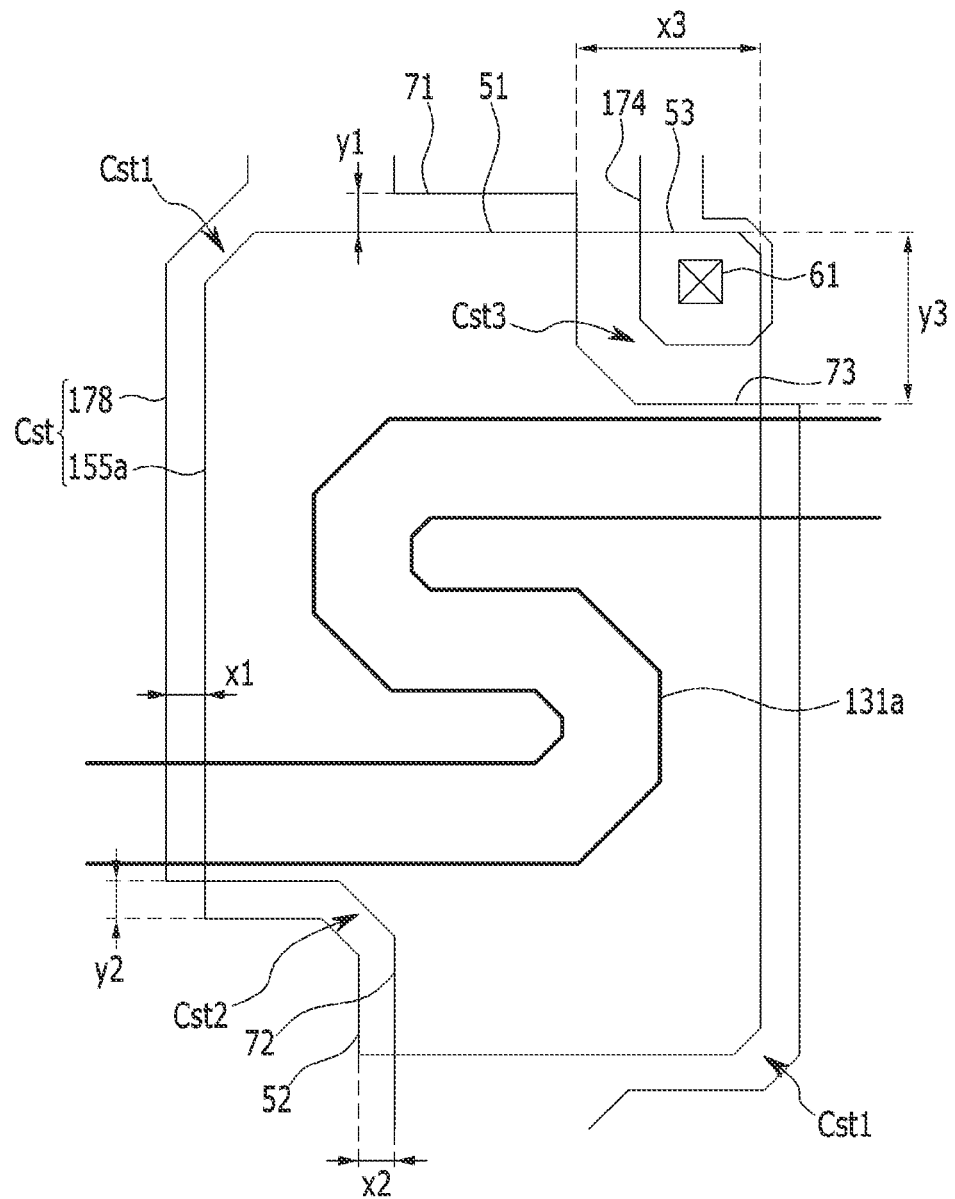
FIG. 5 is an enlarged layout view illustrating the storage capacitor of FIG. 4.
Figure 6:
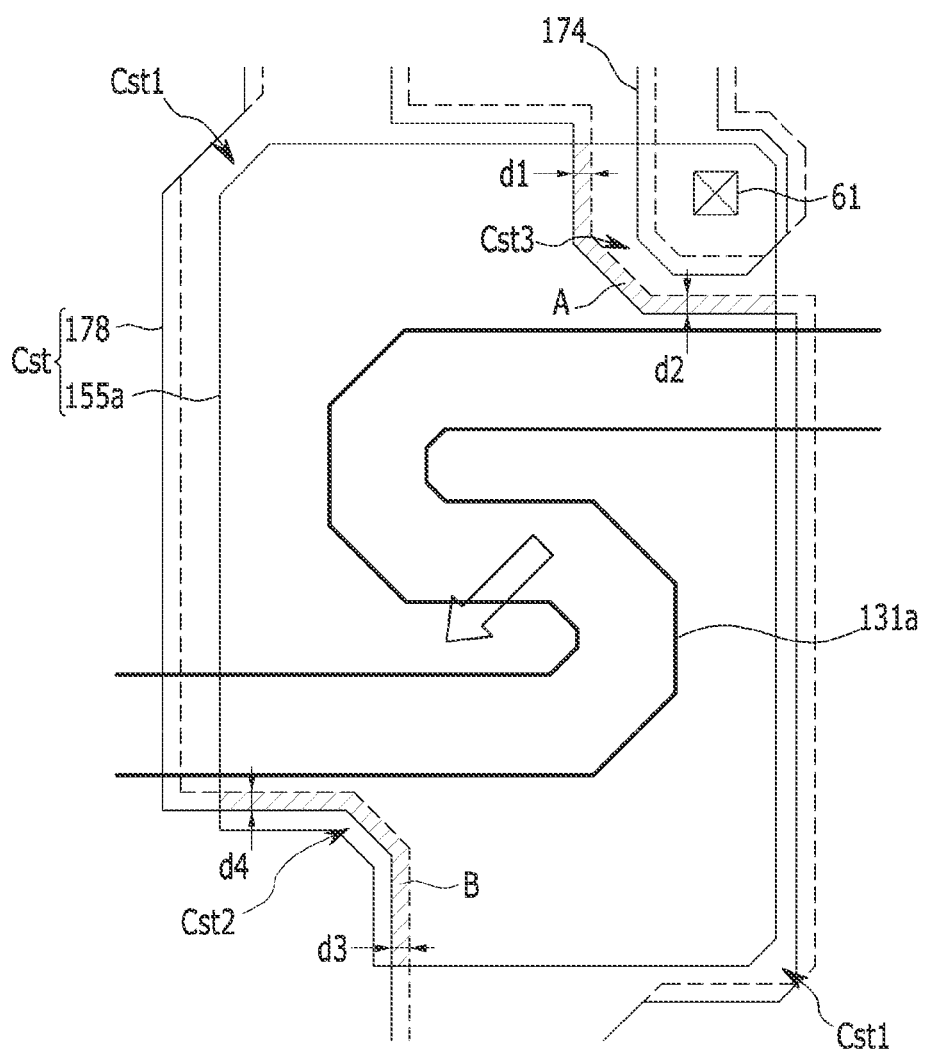
FIG. 6 is an enlarged layout view illustrating the storage capacitor when an overlay change of a second storage electrode occurs in the organic light emitting diode display device according to an example embodiment of the present invention.
Figure 7:
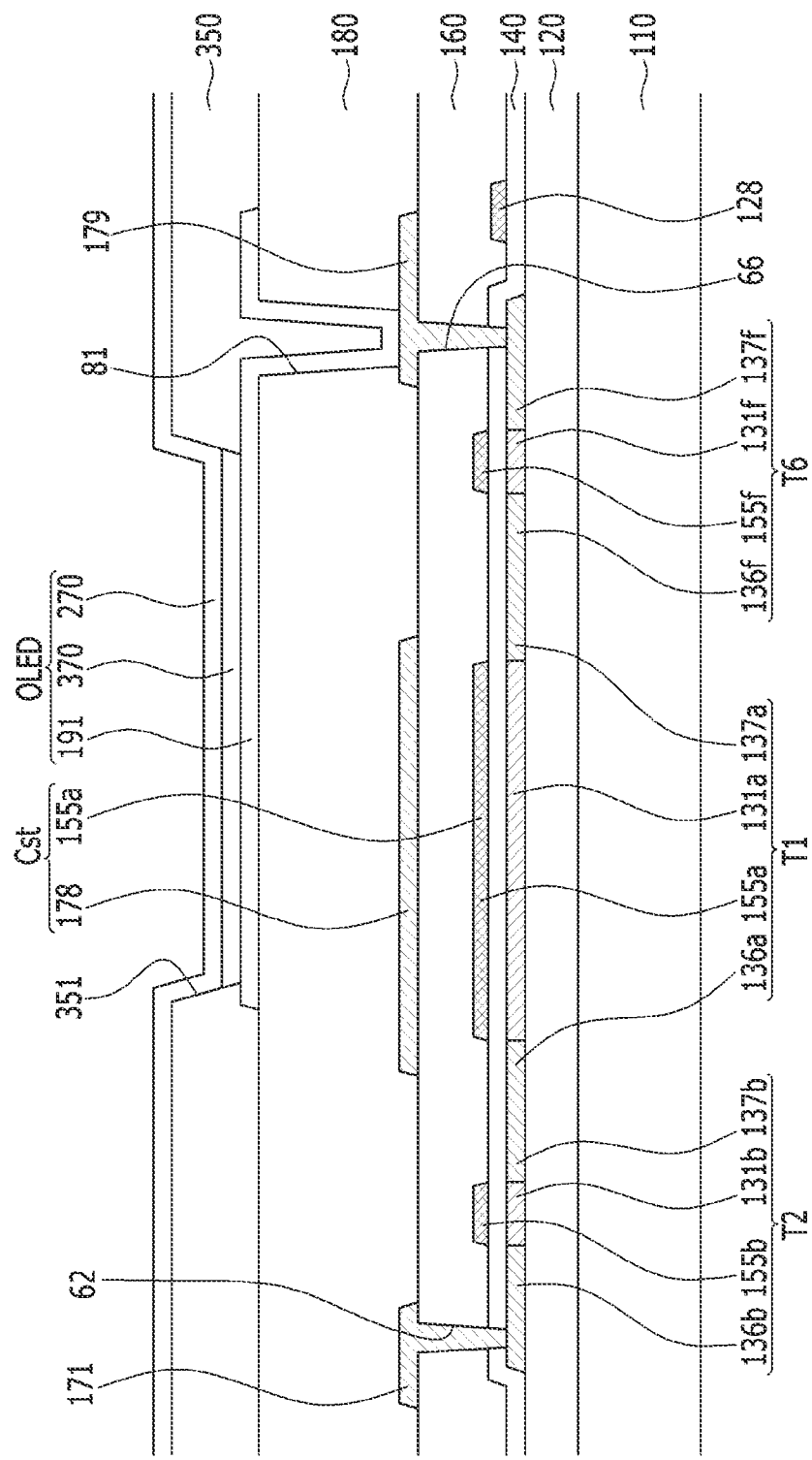
FIG. 7 is a cross-sectional view of the organic light emitting diode display device of FIG. 4 taken along the line VII-VII.
Figure 8:
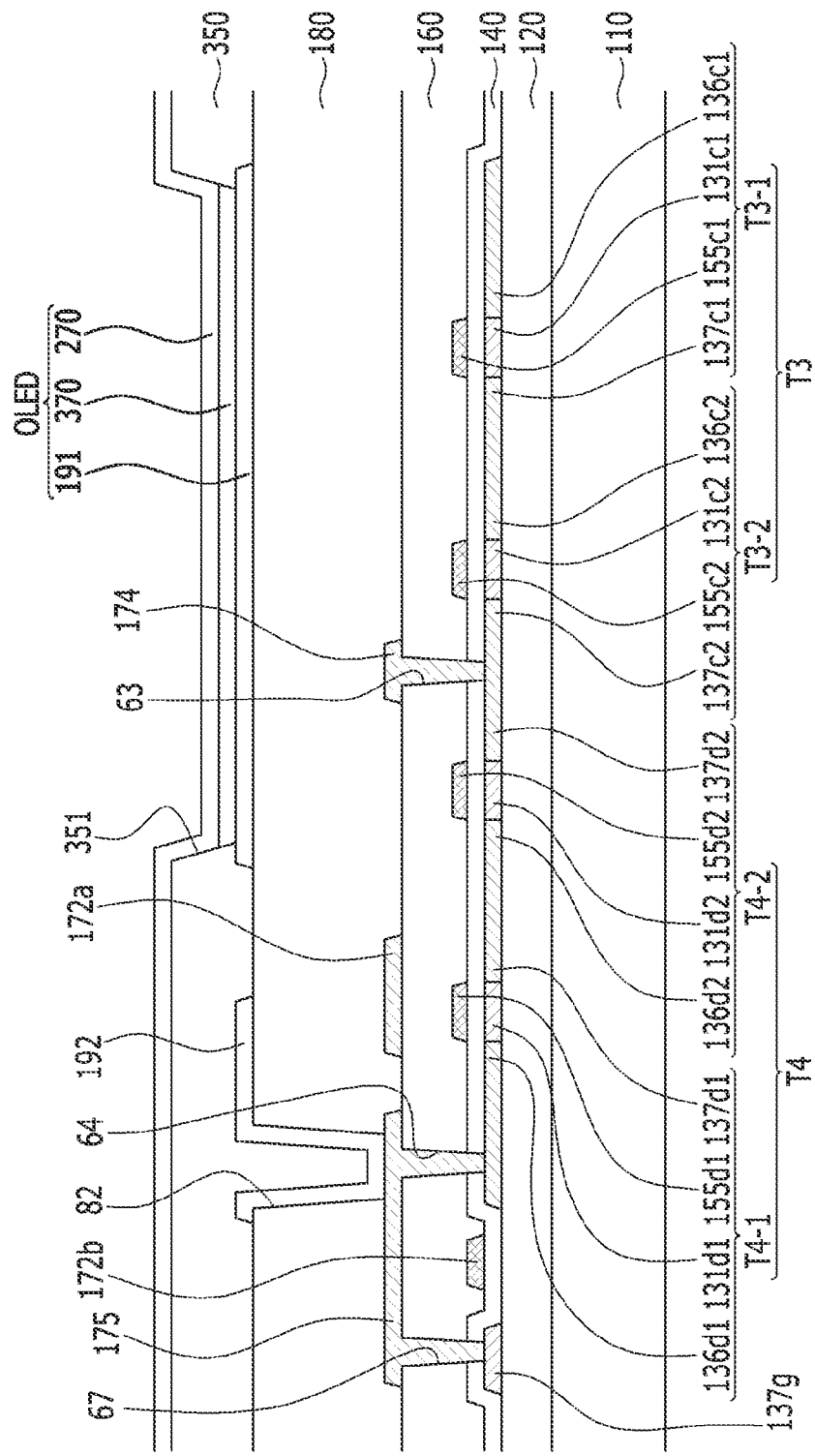
FIG. 8 is a cross-sectional view of the organic light emitting diode display device of FIG. 4 taken along the line VIII-VIII.
Figure 9:
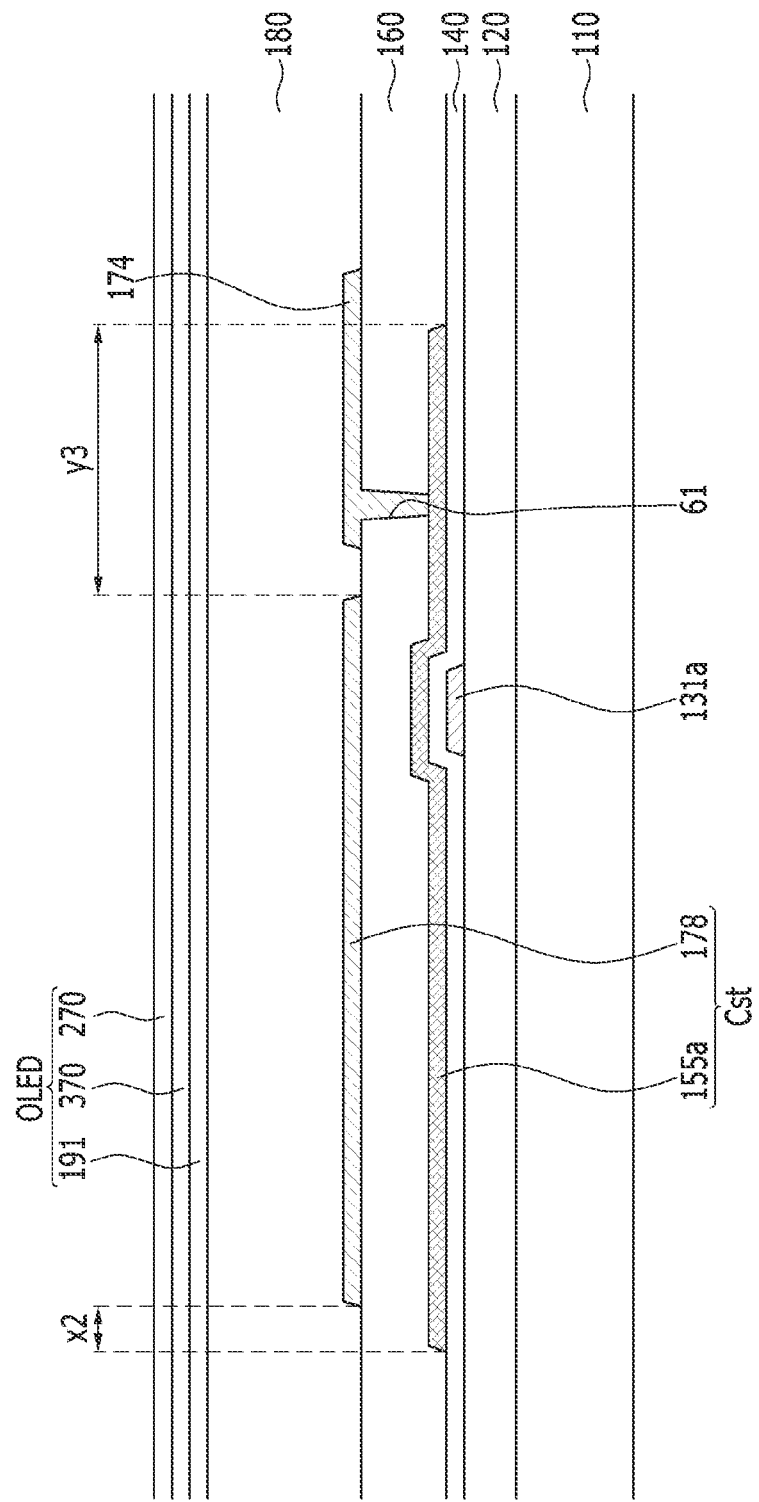
FIG. 9 is a cross-sectional view of the organic light emitting diode display device of FIG. 4 taken along line the IX-IX.

FIG. 3 is a diagram schematically illustrating a plurality of transistors and capacitors in the organic light emitting diode display device according to an example embodiment of the present invention, FIG. 4 is a detailed layout view of FIG. 3, FIG. 5 is an enlarged layout view illustrating the storage capacitor of FIG. 4, FIG. 6 is an enlarged layout view illustrating the storage capacitor when an overlay change of a second storage electrode occurs in the organic light emitting diode display device according to an example embodiment of the present invention, FIG. 7 is a cross-sectional view of the organic light emitting diode display device of FIG. 4 taken along the line VII-VII, FIG. 8 is a cross-sectional view of the organic light emitting diode display device of FIG. 4 taken along the line VIII-VIII, and FIG. 9 is a cross-sectional view of the organic light emitting diode display device of FIG. 4 taken along the line IX-IX.

Hereinafter, a detailed planar structure of the organic light emitting diode display device according to an example embodiment of the present invention will be first described in detail with reference to FIGS. 3 to 6 and a detailed cross-sectional structure will be described in detail with reference to FIGS. 7 to 9.

First, as illustrated in FIG. 3, the organic light emitting diode display device according to an example embodiment of the present invention includes the scan line 121, the previous scan line 122, the light emission control line 123, and the bypass control line 128 which apply the scan signal Sn, the previous scan signal Sn−1, the light emission control signal EM, and the bypass signal BP, respectively, and are formed in (e.g., extending in) a row direction, and includes the data line 171 and the driving voltage line 172 which cross the scan line 121, the previous scan line 122, the light emission control line 123, and the bypass control line 128 and apply the data signal Dm and the driving voltage ELVDD to the pixel, respectively. The initialization voltage Vint is transferred to the compensation transistor T3 through the initialization voltage line 192. The driving voltage line 172 is configured by a first driving voltage line 172a parallel to the data line 171 and a second driving voltage line 172b parallel to the scan line 121. The first driving voltage line 172a and the second driving voltage line 172b are electrically connected with each other.

Further, in the pixel, the driving transistor T1, the switching transistor T2, the compensation transistor T3, the initialization transistor T4, the operation control transistor T5, the light emission control transistor T6, the bypass transistor T7, the storage capacitor Cst, and the organic light emitting diode OLED including a pixel electrode 191, an organic emission layer 370, and a common electrode 270 are formed. In one embodiment, the compensation transistor T3 and the initialization transistor T4 are configured as a dual gate structure transistor in order to block a leakage current.

Channels of the driving transistor T1, the switching transistor T2, the compensation transistor T3, the initialization transistor T4, the operation control transistor T5, the light emission control transistor T6, and the bypass transistor T7 may be formed in one semiconductor 130 connected, and the semiconductor 130 may be formed to be curved in various shapes. The semiconductor 130 may be made of a polycrystalline semiconductor material or an oxide semiconductor material. The oxide semiconductor material may include any one of oxides based on titanium (Ti), hafnium (Hf), zirconium (Zr), aluminum (Al), tantalum (Ta), germanium (Ge), zinc (Zn), gallium (Ga), tin (Sn), or indium (In), and indium-gallium-zinc oxide (InGaZnO4), indium-zinc oxide (Zn—In—O), zinc tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), and hafnium-indium-zinc oxide (Hf—In—Zn—O) which are complex oxides thereof. In the case where the semiconductor 130 is made of the oxide semiconductor material, a separate passivation layer for protecting the oxide semiconductor material which is vulnerable to an external environment such as a high temperature may be added.

The semiconductor 130 includes a channel 131 which is channel-doped with an N-type impurity or a P-type impurity, and a source doping part and a drain doping part which are formed at respective sides of the channel and doped with an opposite-type doping impurity to the doping impurity doped on the channel. In an example embodiment, the source doping part and the drain doping part correspond to the source electrode and the drain electrode, respectively. The source electrode and the drain electrodes formed in the semiconductor 130 may be formed by doping only the corresponding regions. Further, in the semiconductor 130, a region between source electrodes and drain electrodes of different transistors is doped and thus the source electrode and the drain electrode may be electrically connected to each other.

As illustrated in FIG. 4, the channel 131 includes a driving channel 131a formed in the drive transistor T1, a switching channel 131b formed in the switching transistor T2, a compensation channel 131c (e.g., a compensation channel 131c including the first compensation channel 131c1 and the second compensation channel 131c2) formed in the compensation transistor T3, an initialization channel 131d (e.g., an initialization channel 131d including the first initialization channel 131d1 and the second initialization channel 131d2) formed in the initialization transistor T4, an operation control channel 131e formed in the operation control transistor T5, a light emission control channel 131f formed in the light emission control transistor T6, and a bypass channel 131g formed in the bypass transistor T7.

The drive transistor T1 includes the driving channel 131a, a driving gate electrode 155a, a driving source electrode 136a, and a driving drain electrode 137a. The driving channel 131a is curved and may have a meandering shape or a zigzag shape. As such, by forming the curved driving channel 131a, the driving channel 131a may be formed to be elongated in a narrow space. Accordingly, a driving range of the gate voltage applied to the driving gate electrode 155a is increased by the elongated driving channel 131a. Since the driving range of the gate voltage is increased, a gray level of light emitted from the organic light emitting diode OLED may be controlled (e.g., finely controlled) by changing the magnitude of the gate voltage, and as a result, the resolution of the organic light emitting diode display device may be enhanced and display quality may be improved. Various examples such as 'reverse S', 'S', 'M', and 'W' may be implemented by variously modifying the shape of the driving channel 131a.

The driving gate electrode 155a overlaps with the driving channel 131a, and the driving source electrode 136a and the driving drain electrode 137a do not overlap with the driving channel 131a.

The switching transistor T2 includes the switching channel 131b, a switching gate electrode 155b, a switching source electrode 136b, and a switching drain electrode 137b. The switching gate electrode 155b which is a part extended downward from the scan line 121 overlaps with the switching channel 131b, and the switching source electrode 136b and the switching drain electrode 137b do not overlap with the switching channel 131b. The switching source electrode 136b is connected with the data line 171 through a contact hole 62.

Two compensation transistors T3 are formed in order to reduce (or prevent) the leakage current and include a first compensation transistor T3-1 and a second compensation transistor T3-2 which are adjacent to each other. The first compensation transistor T3-1 is positioned around the scan line 121, and the second compensation transistor T3-2 is positioned around a projection of the scan line 121. The first compensation transistor T3-1 includes a first compensation channel 131c1, a first compensation gate electrode 155c1, a first compensation source electrode 136c1, and a first compensation drain electrode 137c1, and the second compensation transistor T3-2 includes a second compensation channel 131c2, a second compensation gate electrode 155c2, a second compensation source electrode 136c2, and a second compensation drain electrode 137c2.

The first compensation gate electrode 155c1 which is a part of the scan line 121 overlaps with the first compensation channel 131c1, and the first compensation source electrode 136c1 and the first compensation drain electrode 137c1 do not overlap with the first compensation channel 131c1. The first compensation source electrode 136c1 is connected with the light emission control source electrode 136f and the driving drain electrode 137a, and the first compensation drain electrode 137c1 is connected with the second compensation source electrode 136c2.

The second compensation gate electrode 155c2 which is a projection protruding upward from the scan line 121 overlaps with the second compensation channel 131c2, and the second compensation source electrode 136c2 and the second compensation drain electrode 137c2 do not overlap with the second compensation channel 131c2. The second compensation drain electrode 137c2 is connected with a first data connection member (or first data connector) 174 through a contact hole 63.

Two initialization transistors T4 are formed in order to reduce (or prevent) the leakage current and include a first initialization transistor T4-1 and a second initialization transistor T4-2 which are adjacent to each other. The first initialization transistor T4-1 is positioned around the previous scan line 122, and the second initialization transistor T4-2 is positioned around a projection of the previous scan line 122. The first initialization transistor T4-1 includes a first initialization channel 131d1, a first initialization gate electrode 155d1, a first initialization source electrode 136d1, and a first initialization drain electrode 137d1, and the second initialization transistor T4-2 includes a second initialization channel 131d2, a second initialization gate electrode 155d2, a second initialization source electrode 136d2, and a second initialization drain electrode 137d2.

The first initialization gate electrode 155d1 which is a part of the previous scan line 122 overlaps with the first initialization channel 131d1, and the first initialization source electrode 136d1 and the first initialization drain electrode 137d1 do not overlap with the first initialization channel 131d1. The first initialization source electrode 136d1 is connected with a second data connection member (or second data connector) 175 through a contact hole 64, and the first initialization drain electrode 137d1 is connected with the second initialization source electrode 136d2.

The second initialization gate electrode 155d2 which is a projection protruding downward from the previous scan line 122 overlaps with the second initialization channel 131d2, and the second initialization source electrode 136d2 and the second initialization drain electrode 137d2 do not overlap with the second initialization channel 131d2. The second initialization drain electrode 137d2 is connected with the first data connection member 174 through the contact hole 63.

As such, according to an embodiment the compensation transistor T3 includes two transistors such as the first compensation transistor T3-1 and the second compensation transistor T3-2, the initialization transistor T4 includes two transistors such as the first initialization transistor T4-1 and the second initialization transistor T4-2, and as a result, it is possible to more efficiently reduce (or prevent) the leakage current from being generated by blocking an electron moving path of the semiconductor 130 in the off state.

The operation control transistor T5 includes an operation control channel 131e, an operation control gate electrode 155e, an operation control source electrode 136e, and an operation control drain electrode 137e. The operation control gate electrode 155e which is a part of the light emission control line 123 overlaps with the operation control channel 131e, and does not overlap with the operation control source electrode 136e and the operation control drain electrode 137e. The operation control source electrode 136e is connected with a part of the driving voltage line 172 through a contact hole 65.

The light emission control transistor T6 includes a light emission control channel 131f, a light emission control gate electrode 155f, a light emission control source electrode 136f, and a light emission control drain electrode 137f. The light emission control gate electrode 155f which is a part of the light emission control line 123 overlaps with the light emission control channel 131f, and does not overlap with the light emission control source electrode 136f and the light emission control drain electrode 137f. The light emission control drain electrode 137f is connected with a third data connection member (or third data connector) 179 through a contact hole 66.

The bypass transistor T7 includes a bypass channel 131g, a bypass gate electrode 155g, a bypass source electrode 136g, and a bypass drain electrode 137g. The bypass gate electrode 155g which is a part of the bypass control line 128 overlaps with the bypass channel 131g and does not overlap with the bypass source electrode 136g and the bypass drain electrode 137g. The bypass source electrode 136g is directly connected with the light emission control drain electrode 137f, and the bypass drain electrode 137g is connected with a second data connection member 175 through a contact hole 67.

One end of the driving channel 131a of the driving transistor T1 is connected with the switching drain electrode 137b and the operation control drain electrode 137e, and the other end of the driving channel 131a is connected with the compensation source electrode 136c and the light emission control source electrode 136f.

The storage capacitor Cst includes a first storage electrode 155a and a second storage electrode 178 which are disposed with a second insulating layer 160 therebetween. The first storage electrode 155a corresponds to the driving gate electrode 155a, and the second storage electrode 178 is an extended region of the first driving voltage line 172a and formed one by one for every pixel. In one embodiment, the second insulating layer 160 is a dielectric material, and a storage capacitance is determined by charges stored in storage capacitor Cst and a voltage between the two electrodes 155a and 178. As such, the driving gate electrode 155a is used as the first storage electrode 155a, and as a result, it is possible to provide (or ensure) a space in which the storage capacitor may be formed using less space because of the driving channel 131a having a large area in the pixel.

The first storage electrode 155a which is the driving gate electrode 155a is connected with the first data connection member 174 through the contact hole 61. The first data connection member 174 is formed on the same layer to be substantially parallel to the data line 171 and connects the driving gate electrode 155a and the second compensation drain electrode 137c2 of the second compensation transistor T3-2, and the second initialization drain electrode 137d2 of the second initialization transistor T4-2.

Accordingly, the storage capacitor Cst stores a storage capacitance corresponding to a difference between the driving voltage ELVDD transferred to the second storage electrode 178 through the first driving voltage line 172a and the gate voltage of the driving gate electrode 155a.

The storage capacitor Cst may have a substantially rectangular shape on a plane and includes a main unit (or main portion) Cst1, a storage compensation unit (or storage compensator) Cst2, and a connection unit (or connector) Cst3. In FIG. 5, the storage compensation unit Cst2 is formed at a lower left side of the storage capacitor Cst having the rectangular shape, the connection unit Cst3 is formed at an upper right side of the storage capacitor Cst having the rectangular shape, and the main unit Cst1 corresponds to most of the region except for the connection unit Cst3 and the storage compensation unit Cst2. Particularly, the connection unit Cst3 corresponds to a part where the first data connection member 174 is connected with the first storage electrode 155a through the contact hole 61.

As illustrated in FIG. 5, in the main unit Cst1, an edge 71 of the second storage electrode 178 is spaced apart from an edge 51 of the first storage electrode 155a by main margin widths x1 and y1 to be positioned outside the edge 51. That is, most of the second storage electrode 178 covers the first storage electrode 155a to maximally provide (or ensure) the storage capacity of the storage capacitor Cst. The main margin widths x1 and y1 include a main horizontal margin width x1 which is a distance between vertical edges and a main vertical margin width y1 which is a distance between horizontal edges.

The storage compensation unit Cst2 is positioned to face the connection unit Cst3 on a diagonal line. In storage compensation unit Cst2, an edge 72 of the second storage electrode 178 is spaced apart from an edge 52 of the first storage electrode 155a by the compensation margin widths x2 and y2 to be positioned inside the edge 52 (e.g., offset from the edge 52 of the first storage electrode 155a in a direction toward the center of the second storage electrode 178). In detail, the edge of the first storage electrode 155a of the storage compensation unit Cst2 corresponds to a first corner cut portion 52 which is dented at the corner portion of the first storage electrode 155a having the substantially rectangular shape, and the edge of the second storage electrode 178 of the storage compensation unit Cst2 corresponds to a second corner cut portion 72 which is dented at the corner portion of the second storage electrode 178 having the substantially rectangular shape. In addition, the second corner cut portion 72 is spaced apart from the first corner cut portion 52 by the compensation margin widths x2 and y2 to be positioned inside the first corner cut portion 52 (e.g., offset from the first corner cut portion 52 in a direction toward the center of the second storage electrode 178).

The compensation margin widths x2 and y2 include a compensation horizontal margin width x2 which is a distance between vertical edges and a compensation vertical margin width y2 which is a distance between horizontal edges.

In addition, in the connection unit Cst3, the edge 73 of the second storage electrode 178 is positioned inside the edge 53 of the first storage electrode 155a (e.g., offset from the edge 53 of the first storage electrode 155a in a direction toward the center of the second storage electrode 178). In detail, the edge 53 of the first storage electrode 155a of the connection unit Cst3 corresponds to a third corner 53 of the first storage electrode 155a having the substantially rectangular shape, and the edge 73 of the second storage electrode 178 of the connection unit Cst3 corresponds to a third corner cut portion 73 which is dented at the corner portion of the second storage electrode 178 having the substantially rectangular shape.

As such, by forming the storage compensation unit Cst2 positioned to face the connection unit Cst3 on the diagonal line, when the first storage electrode 155a and the second storage electrode 178 are formed, even though an overlay change occurs due to nonuniformity of an exposure amount, the storage capacitance may be maintained substantially the same as before.

Hereinafter, an effect that the storage capacitance is substantially maintained despite the overlay change in the storage capacitor structure of the organic light emitting diode display device according to an example embodiment of the present invention will be described in detail with reference to FIG. 6.

As illustrated in FIG. 6, when the overlay change of the second storage electrode 178 occurs in a lower left diagonal direction based on a position of the first storage electrode 155a, the third corner cut portion 73 of the second storage electrode 178 of the connection unit Cst 3 moves by a distance d1 in a horizontal direction (e.g., based on an originally predetermined position) and concurrently (e.g., simultaneously) moves by a distance d2 in a vertical direction. Accordingly, an overlapping area of the first storage electrode 155a and the second storage electrode 178 is decreased by region A and thus the storage capacitance of the connection unit Cst 3 is decreased. However, since the second corner cut portion 72 of the second storage electrode 178 of the storage compensation unit Cst2 moves by a distance d3 in a horizontal direction (e.g., based on an originally predetermined position) and concurrently (e.g., simultaneously) moves by a distance d4 in a vertical direction, the overlapping area of the first storage electrode 155a and the second storage electrode 178 is increased by region B and thus the storage capacitance of the storage compensation unit Cst2 is increased. As such, the storage capacitance of the storage compensation unit Cst2 is increased by an amount that corresponds to the decreased storage capacitance of the connection unit Cst 3, and as a result, there is little or no change in the storage capacitance.

Further, the main margin widths x1 and y1 may correspond to (or may be) a sum of a process margin m1 of the edge of the first storage electrode 155a and a process margin m2 of the edge of the second storage electrode 178.

In addition, the compensation margin widths x2 and y2 may be in a range from a width smaller than 1% of the main margin widths x1 and y1 to substantially the same width as the main margin widths x1 and y1. For example, a minimum value of the compensation margin widths x2 and y2 may be a difference value between the main margin widths x1 and y1 and 1% of the main margin widths x1 and y1, and a maximum value of the compensation margin widths x2 and y2 may be substantially the same value as the main margin widths.

As such, according to an embodiment since the main margin widths are based on a maximum of process margin, the storage capacitance may be substantially maintained (e.g., always maintained) despite the overlay change within the same compensation margin width range as the main margin width.

In this case, the second driving voltage line 172b is connected with the first driving voltage line 172a through a contact hole 68. As such, in one embodiment the driving voltage line 172 has a mesh structure by connecting the vertical first driving voltage line 172a and the horizontal second driving voltage line 172b to reduce (or prevent) a voltage drop of the driving voltage ELVDD.

The third data connection member 179 is connected with the pixel electrode 191 through the contact hole 81, and the second data connection member 175 is connected with the initialization voltage line 192 through the contact hole 82.

Hereinafter, a sectional structure of the organic light emitting diode display device according to an example embodiment of the present invention will be described in detail according to a lamination order with reference to FIGS. 7 to 9.

In this case, since a lamination structure of the operation control transistor T5 is mostly the same as that of the light emission control transistor T6, a detailed description of the operation control transistor T5 will be omitted.

A buffer layer 120 may be formed on a substrate 110. The substrate 110 may be formed by insulating substrates made of glass, crystal, ceramic, plastic, and the like. The buffer layer 120 blocks impurities from the substrate 110 during a crystallization process for forming a polycrystalline semiconductor to improve characteristics of the polycrystalline semiconductor and reduce stress applied to the substrate 110.

On the buffer layer 120, a semiconductor 130 is formed, which includes a driving channel 131a, a switching channel 131b, a compensation channel 131c, an initialization channel 131d, an operation control channel 131e, and a light emission control channel 131f. A driving source electrode 136a and a driving drain electrode 137a are formed on respective sides of the driving channel 131a in the semiconductor 130 and a switching source electrode 136b and a switching drain electrode 137b are formed on respective sides of the switching channel 131b. In addition, a first compensation source electrode 136c1 and a first compensation drain electrode 137c1 are formed on respective sides of a first compensation channel 131c1, a second compensation source electrode 136c2 and a second compensation drain electrode 137c2 are formed on respective sides of a second compensation channel 131c2, a first initialization source electrode 136d1 and a first initialization drain electrode 137d1 are formed on respective sides of a first initialization channel 131d1, and a second initialization source electrode 136d2 and a second initialization drain electrode 137d2 are formed on respective sides of a second initialization channel 131d2. In addition, an operation control source electrode 136e and an operation control drain electrode 137e are formed on respective sides of the operation control channel 131e and a light emission control source electrode 136f and a light emission control drain electrode 137f are formed on respective sides of the light emission control channel 131f.

A first insulating layer 140 covering the semiconductor 130 is formed on semiconductor 130. On the first insulating layer 140, gate wires 121, 122, 123, 155a, 155b, 155c1, 155c2, 155d1, 155d2, 155e, 155f, and 172b which include a scan line 121 including a switching gate electrode 155b, a first compensation gate electrode 155c1, and a second compensation gate electrode 155c2, a previous scan line 122 including a first initialization gate electrode 155d1 and a second initialization gate electrode 155d2, a light emission control line 123 including an operation control gate electrode 155e and a light emission control gate electrode 155f, a driving gate electrode (first storage electrode) 155a, and a second driving voltage line 172b are formed.

A second insulating layer 160 covering the gate wires and the first insulating layer 140 is formed on the gate wires 121, 122, 123, 155a, 155b, 155c1, 155c2, 155d1, 155d2, 155e, 155f, and 172b and the first insulating layer 140. In one embodiment, the first insulating layer 140 and the second insulating layer 160 are made of nitride silicon (SiNx) or silicon oxygen, e.g., silicon dioxide (SiO2).

Data wires 171, 172a, 174, 175, 178, and 179 which include a data line 171, a first driving voltage line 172a including a second storage electrode 178, a first data connection member 174, a second data connection member 175, and a third data connection member 179 are formed on the second insulating layer 160.

As such, since the second storage electrode 178 is formed by the same material and on the same layer as the second driving voltage line 172a and the data line 171, the second storage electrode 178 need not to be formed on a separate layer and by separate metal, and as a result, the number of masks used during manufacturing may be reduced.

The data line 171 is connected with the switching source electrode 136b through contact holes 62 formed on the first insulating layer 140 and the second insulating layer 160, one end of the first data connection member 174 is connected with the first storage electrode 155a through contact holes 61 formed on the first insulating layer 140 and the second insulating layer 160, and the other end of the first data connection member 174 is connected with the second compensation drain electrode 137c2 and the second initialization drain electrode 137d2 through contact holes 63 formed on the first insulating layer 140 and the second insulating layer 160.

The second data connection member 175 is connected with the first initialization source electrode 136d1 through contact holes 64 formed on the first insulating layer 140 and the second insulating layer 160 and connected with a bypass drain electrode 137g through contact holes 67 formed on the first insulating layer 140 and the second insulating layer 160. The bypass drain electrode 137g and the first initialization source electrode 136d1 are not directly connected to each other and are indirectly connected to each other through the second data connection member 175 to prevent a transistor from being formed in the vicinity of the second driving voltage line 172b.

In addition, a rectangular third data connection member 179 is connected with the light emission control drain electrode 137f through contact holes 66 formed on the first insulating layer 140 and the second insulating layer 160.

A passivation layer 180 covering the data wires and the second insulating layer 160 is formed on the data wires 171, 172a, 174, 175, 178, and 179 and the second insulating layer 160. The passivation layer 180 may be formed by an organic layer. A pixel electrode 191 and an initialization voltage line 192 are formed on the passivation layer 180. The third data connection member 179 is connected with the pixel electrode 191 through a contact hole 81 formed on the passivation layer 180 and the second data connection member 175 is connected with the initialization voltage line 192 through a contact hole 82 formed on the passivation layer 180.

A pixel defined layer (PDL) 350 covering the passivation layer 180, the initialization voltage line 192, and the pixel electrode 191 is formed on edges of the passivation layer 180, the initialization voltage line 192, and the pixel electrode 191 and the pixel defined layer 350 has a pixel opening 351 that exposes the pixel electrode 191. The pixel defined layer 350 may be made of resins such as polyacrylates resin and polyimides or silica-series inorganic materials.

An organic emission layer 370 is formed on the pixel electrode 191 exposed by the pixel opening 351 and a common electrode 270 is formed on the organic emission layer 370. As such, an organic light emitting diode (OLED) is formed, which includes the pixel electrode 191, the organic emission layer 370, and the common electrode 270.

In one embodiment, the pixel electrode 191 is an anode which is a hole injection electrode and the common electrode 270 is a cathode which is an electron injection electrode. However, an example embodiment according to the present invention is not necessarily limited thereto and the pixel electrode 191 may be the cathode and the common electrode 270 may be the anode according to a driving method of the organic light emitting diode display device. When holes and electrons are injected into the organic emission layer 370 from the pixel electrode 191 and the common electrode 270, respectively, excitons formed (or acquired) by combining the injected holes and electrons fall from an excitation state to a ground state, and light is emitted.

The organic emission layer 370 may be made of a low-molecular organic material (or a low-molecular weight organic material) or a high-molecular organic material (or a high-molecular weight organic material) such as poly 3,4-ethylenedioxythiophene (PEDOT). Further, the organic emission layer 370 may be formed by multiple layers including at least one of an emission layer, a hole injection layer (HIL), a hole transporting layer (HTL), an electron transporting layer (ETL), and an electron injection layer (EIL). In one embodiment, when the organic emission layer 370 includes all of the layers, the hole injection layer is disposed on the pixel electrode 191 which is the positive electrode, and the hole transporting layer, the emission layer, the electron transporting layer, and the electron injection layer are sequentially laminated thereon.

The organic emission layer 370 may include a red organic emission layer emitting red light, a green organic emission layer emitting green light, and a blue organic emission layer emitting blue light, and the red organic emission layer, the green organic emission layer, and the blue organic emission layer are formed at a red pixel, a green pixel, and a blue pixel, respectively to implement color images.

Further, in the organic emission layer 370, all of the red organic emission layer, the green organic emission layer, and the blue organic emission layer are together laminated on the red pixel, the green pixel, and the blue pixel and a red color filter, a green color filter, and a blue color filter are formed for each pixel to implement the color images. As another example, a white organic emission layer emitting a white light is formed on all of the red pixel, the green pixel, and the blue pixel and the red color filter, the green color filter, and the blue color filter are formed for each pixel to implement the color images. When the color images are implemented by using the white organic emission layer and the color filters, a deposition mask for depositing the red organic emission layer, the green organic emission layer, and the blue organic emission layer on individual pixels, that is, the red pixel, the green pixel, and the blue pixel, respectively may not be used.

The white organic emission layer described in another example may be, of course, formed by one organic emission layer and includes even a configuration that may emit white light by laminating a plurality of organic emission layers. As an example, the white organic emission layer may include a configuration that enables the white light to be emitted by combining at least one yellow organic emission layer and at least one blue organic emission layer, a configuration that enables the white light to be emitted by combining at least one cyan organic emission layer and at least one red organic emission layer, a configuration that enables the white light to be emitted by combining at least one magenta organic emission layer and at least one green organic emission layer, and the like.

A sealing member protecting the organic light emitting diode OLED may be formed on the common electrode 270, and the sealing member may be sealed on the substrate 110 by a sealant and made of various materials including glass, crystal, ceramic, plastic, and metal. Meanwhile, an inorganic layer and an organic layer may be deposited on the common electrode 270 without using the sealant to form a thin-film sealing layer.

Meanwhile, in an example embodiment, a storage compensation unit is constituted by a first corner cut portion 52 of a first storage electrode and a second corner cut portion 72 of the second storage electrode 178, but another example embodiment is also possible, in which the storage compensation unit is constituted by a first corner of the first storage electrode and a second corner of the second storage electrode in order to maximize the storage capacitance.

Hereinafter, an organic light emitting diode display device according to another example embodiment of the present invention will be described in detail with reference to FIGS. 10 to 12.

Figure 10:
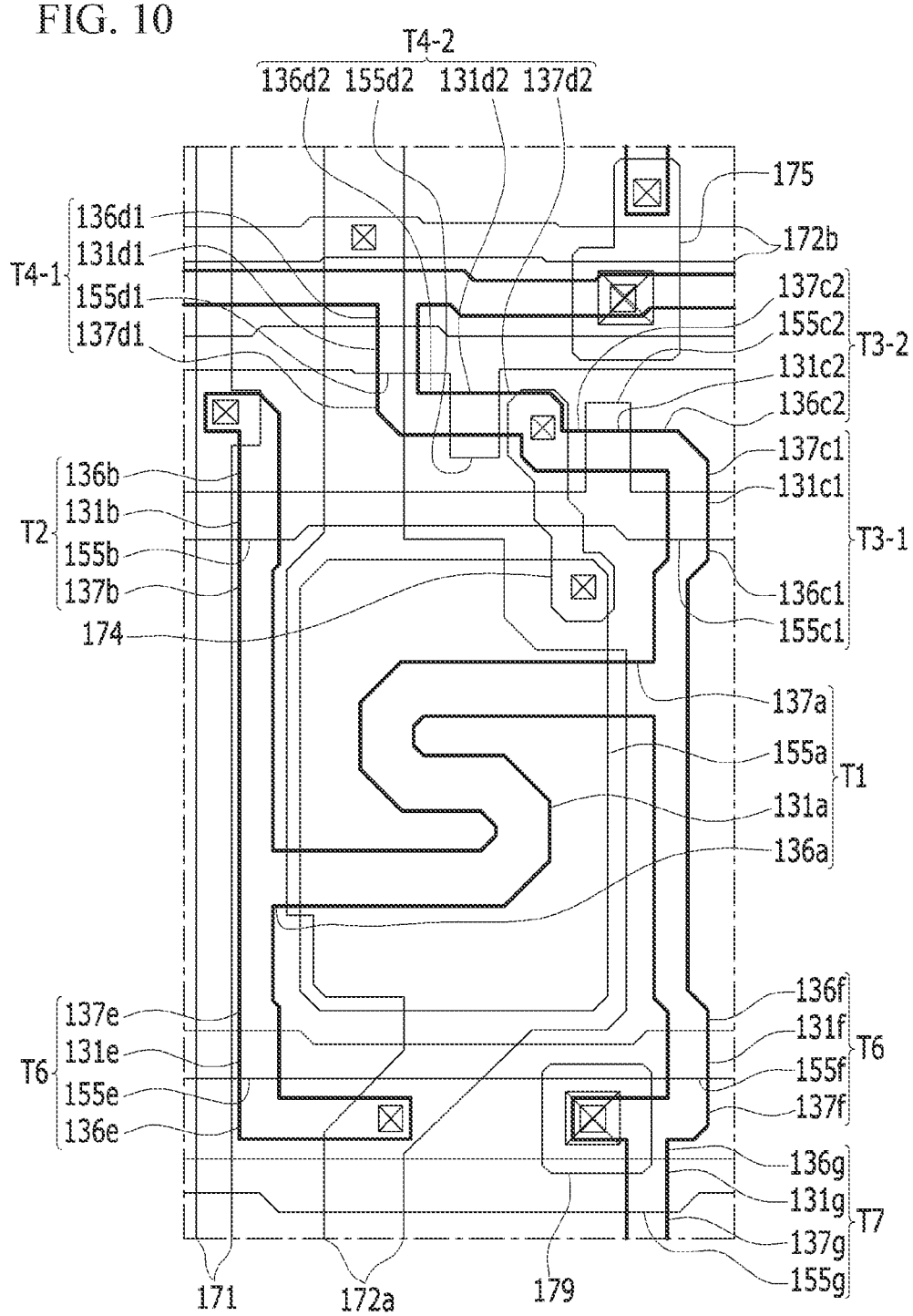
FIG. 10 is a layout view of an organic light emitting diode display device according to another example embodiment of the present invention.
Figure 11:
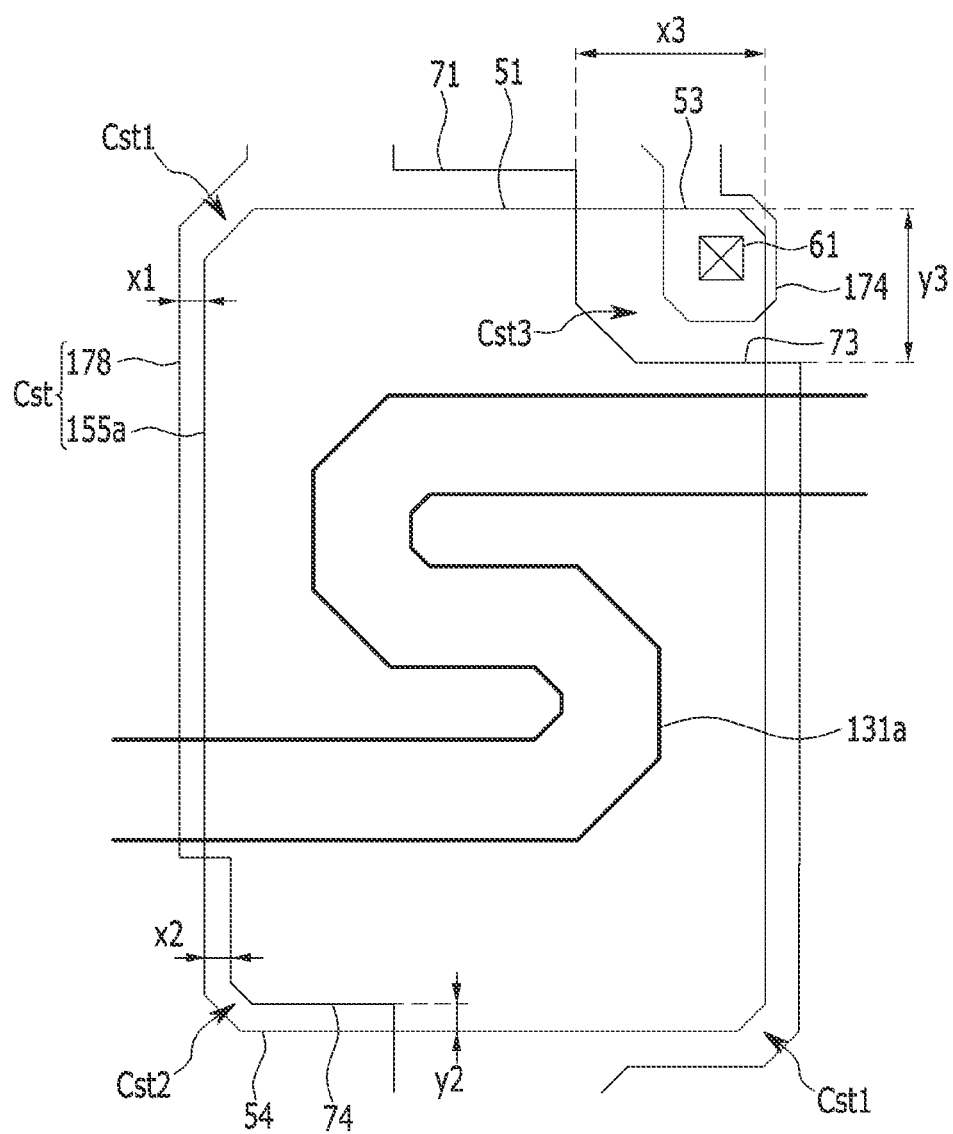
FIG. 11 is an enlarged layout view illustrating a storage capacitor of FIG. 10.
Figure 12:
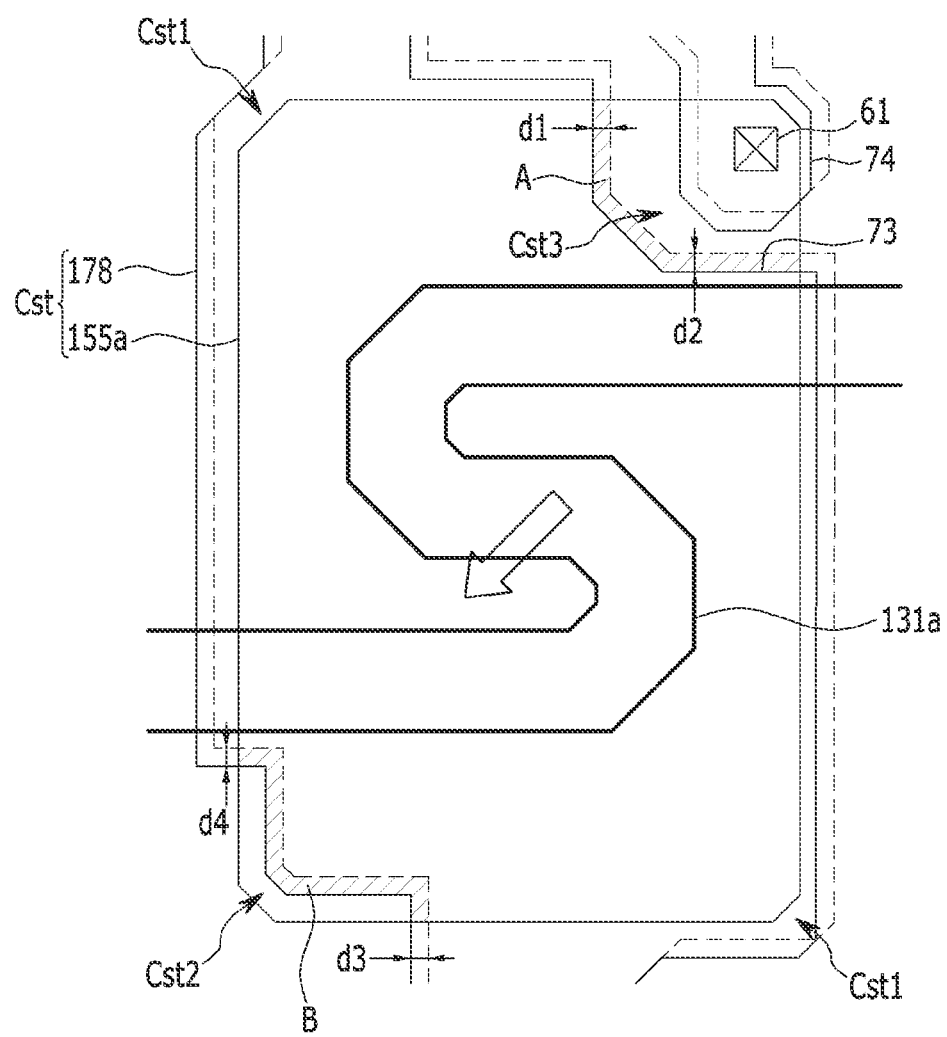
FIG. 12 is an enlarged layout view illustrating the storage capacitor when an overlay change of a second storage electrode occurs in FIG. 11.

FIG. 10 is a layout view of an organic light emitting diode display device according to another example embodiment of the present invention, FIG. 11 is an enlarged layout view illustrating a storage capacitor of FIG. 10, and FIG. 12 is an enlarged layout view illustrating a storage capacitor when an overlay change of the second storage electrode occurs in FIG. 11.

When comparing another example embodiment illustrated in FIGS. 10 to 12 with an example embodiment illustrated in FIGS. 1 to 9, both embodiments are substantially the same as each other except for a difference in structure of the storage compensation unit. Therefore, a duplicated description will be omitted.

As illustrated in FIGS. 10 and 11, in a storage compensation unit Cst2 of the organic light emitting diode display device according to another example embodiment of the present invention, an edge 74 of the second storage electrode 178 is spaced apart from an edge 54 of the first storage electrode 155a by a compensation margin width x2, y2 to be positioned inside the edge 54 (e.g., offset from the edge 54 in a direction toward the center of the second storage electrode 178). In detail, the edge of the first storage electrode 155a of the storage compensation unit Cst2 corresponds to a first corner 54 of the first storage electrode 155a having a substantially rectangular shape and the edge of the second storage electrode 178 of the storage compensation unit Cst2 corresponds to a second corner 74 of the second storage electrode 178 having the substantially rectangular shape. In addition, the second corner 74 is spaced apart from the first corner 54 by the compensation margin width x2, y2 to be positioned inside the first corner 54 (e.g., offset from the first corner 54 in a direction toward the center of the second storage electrode 178).

In addition, in a connection unit Cst3, an edge 73 of the second storage electrode 178 is positioned inside an edge 53 of the first storage electrode 155a (e.g., offset from the edge 53 in a direction toward the center of the second storage electrode 178). In detail, the edge 53 of the first storage electrode 155a of the connection unit Cst3 corresponds to a third corner 53 of the first storage electrode 155a having the substantially rectangular shape and the edge 73 of the second storage electrode 178 corresponds to a third corner cut portion 73 which is dented at a corner portion of the second storage electrode 178 having the substantially rectangular shape.

As such, the storage compensation unit is constituted by a first corner of the first storage electrode and a second corner of the second storage electrode to maximize the storage capacitance as compared with the example embodiment of FIGS. 1 to 9 in which the storage compensation unit is constituted by the first corner cut portion 52 of the first storage electrode and the second corner cut portion 72 of the second storage electrode 178.

Further, the storage compensation unit positioned while facing the connection unit Cst3 on a diagonal line is formed to maintain the storage capacitance substantially the same as before even in the case where the overlay is changed due to a problem such as a uniform exposure amount when the first storage electrode 155a or the second storage electrode 178 is formed.

Hereinafter, an effect in which the storage capacitance is substantially maintained in spite of the overlay change in a storage capacitor structure of the organic light emitting diode display device according to another example embodiment of the present invention will be described in detail with reference to FIG. 12.

As illustrated in FIG. 12, when the overlay change in the second storage electrode 178 occurs in a lower left diagonal direction based on the position of the first storage electrode 155a, the third corner cut portion 73 of the second storage electrode 178 of the connection unit Cst3 moves by a distance d2 in a vertical direction while moving by a distance d1 in a horizontal direction (e.g., based on an originally predetermined position). Therefore, an overlapping area between the first storage electrode 155a and the second storage electrode 178 is reduced by region A, and as a result, storage capacitance of the connection unit Cst3 is reduced. However, since the second corner 74 of the second storage electrode 178 of the storage compensation unit Cst2 moves by a distance d4 in the vertical direction while moving by a distance d3 in the horizontal direction (e.g., based on the originally predetermined position), the overlapping area between the first storage electrode 155a and the second storage electrode 178 is increased by region B, and as a result, storage capacitance of the storage compensation unit Cst2 is increased. As such, since the storage capacitance is increased in the storage compensation unit Cst2 by an amount corresponding to the storage capacitance reduced in the connection unit Cst3, the storage capacitance is not correspondingly changed.

Meanwhile, the storage compensation unit is positioned to face the connection unit positioned at the corner in the diagonal line in an example embodiment, but yet another example embodiment is possible, in which when the connection unit is positioned on a side portion, the storage compensation unit is also positioned on the side portion so that the connection unit and the storage compensation unit are facing each other.

Hereinafter, an organic light emitting diode display device according to yet another example embodiment of the present invention will be described in detail with reference to FIGS. 13 to 14.

Figure 13:
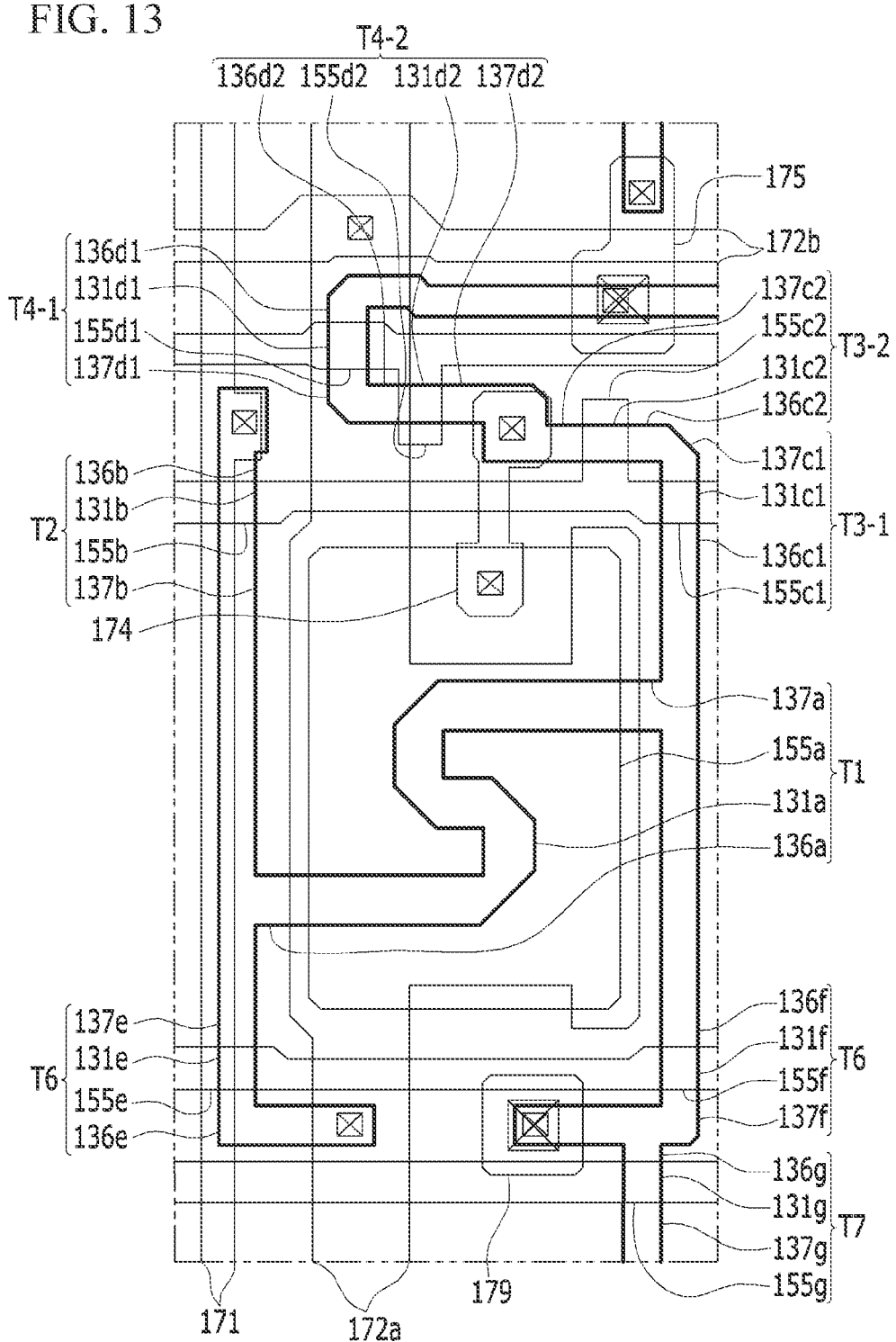
FIG. 13 is a layout view of an organic light emitting diode display device according to yet another example embodiment of the present invention.
Figure 14:
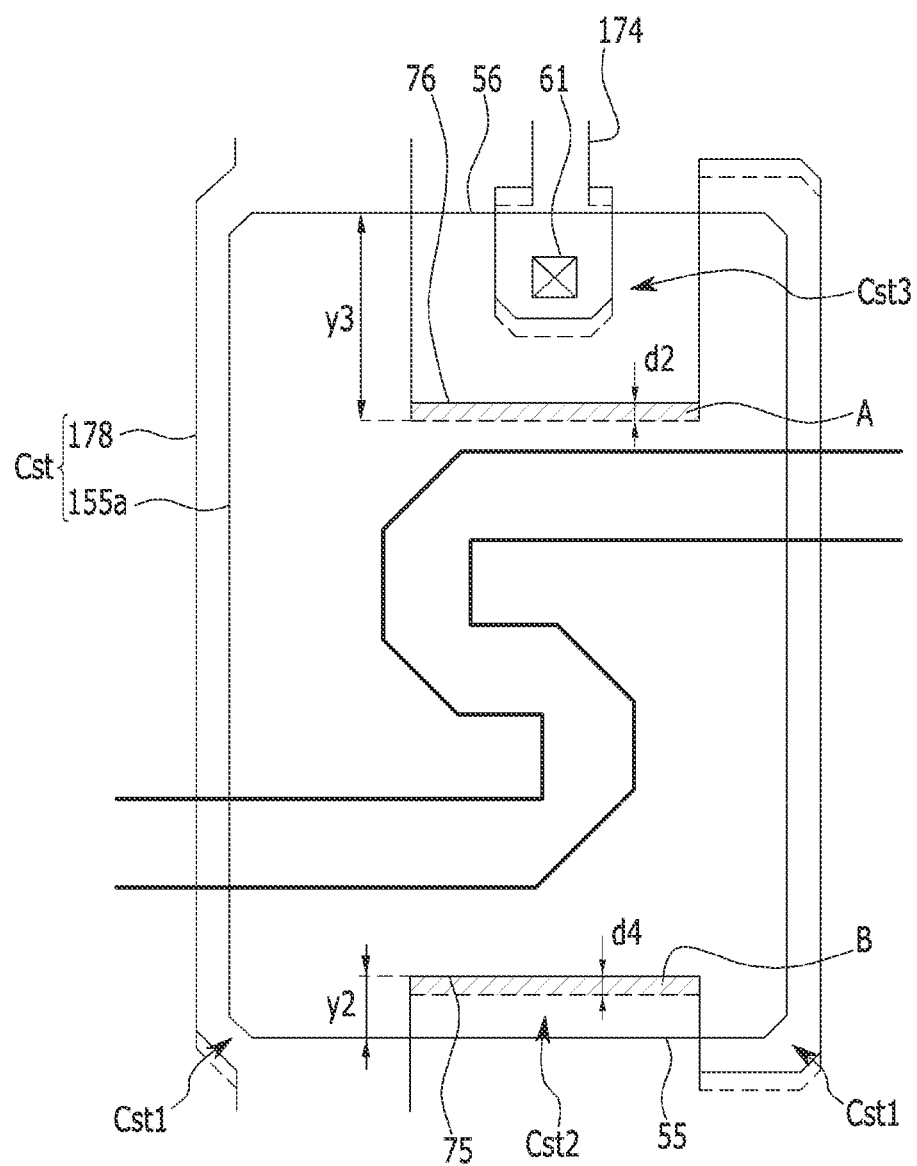
FIG. 14 is an enlarged layout view illustrating the storage capacitor when an overlay change of a second storage electrode occurs in FIG. 13.

FIG. 13 is a layout view of an organic light emitting diode display device according to yet another example embodiment of the present invention, and FIG. 14 is an enlarged layout view illustrating the storage capacitor when an overlay change of a second storage electrode occurs in FIG. 13.

When comparing yet another example embodiment illustrated in FIGS. 13 to 14 with the example embodiment illustrated in FIGS. 1 to 9, both example embodiments are substantially the same as each other except for the difference in structure of the storage compensation unit. Therefore, a duplicated description will be omitted.

As illustrated in FIGS. 13 and 14, a storage capacitor Cst of the organic light emitting diode display device according to yet another example embodiment of the present invention has a substantially rectangular plane shape and includes a main unit Cst1, a second compensation unit Cst2, and a connection unit Cst3. The storage compensation unit Cst2 is formed at a central lower portion of the rectangular storage capacitor Cst, the connection unit Cst3 is formed at a central upper portion of the rectangular storage capacitor Cst, and the main portion Cst1 corresponds to most of the region other than the connection unit Cst3 and the storage compensation unit Cst2.

The storage compensation unit Cst2 is positioned facing the connection unit Cst3. In the storage compensation unit Cst2, an edge 75 of the second storage electrode 178 is spaced apart from an edge 55 of the first storage electrode 155a by a compensation margin width y2 to be positioned inside the edge 55 (e.g., offset from the edge 55 in a direction toward the center of the second storage electrode 178). In detail, the edge of the first storage electrode 155a of the storage compensation unit Cst2 corresponds to a first side portion 55 of the first storage electrode 155a having the substantially rectangular shape and the edge 75 of the second storage electrode 178 of the storage compensation unit Cst2 corresponds to a second side portion 75 of the second storage electrode 178 having the substantially rectangular shape. In addition, the second side portion 75 is spaced apart from the first side portion 55 by the compensation margin width y2 to be positioned inside the first side portion 55 (e.g., offset from the first side portion 55 in a direction toward the center of the second storage electrode 178).

In an example embodiment, the compensation margin width y2 means only a compensation vertical margin width y2 which is a gap between horizontal edges.

In addition, in the connection unit Cst3, an edge 76 of the second storage electrode 178 is positioned inside an edge 56 of the first storage electrode 155a (e.g., offset from the edge 56 in a direction toward the center of the second storage electrode 178). In detail, the edge 56 of the first storage electrode 155a of the connection unit Cst3 corresponds to a third side portion 56 of the first storage electrode 155a having the substantially rectangular shape and the edge 76 of the second storage electrode 178 corresponds to a fourth side portion 76 of the second storage electrode 178 having the substantially rectangular shape.

As described above, according to an embodiment, when the connection unit is positioned on the side portion, there is little or no variation in capacitance in the horizontal overlay change and there is a variation in capacitance only in the vertical overlay change to minimize a variation in storage capacitance.

Further, the storage compensation unit positioned to face the connection unit Cst3 is formed, and as a result, even when the overlay change occurs due to the problem such as the uniform exposure amount when the first storage electrode 155a or the second storage electrode 178 is formed, the storage capacitance may be maintained substantially the same as before.

As illustrated in FIG. 14, when the overlay change in the second storage electrode 178 occurs in a vertical upper direction based on the position of the first storage electrode 155a, the fourth side portion 76 of the second storage electrode 178 of the connection unit Cst3 moves by a distance d2 in a vertical direction (e.g., based on an originally predetermined position). Therefore, the overlapping area between the first storage electrode 155a and the second storage electrode 178 is increased by area A, and as a result, the storage capacitance of the connection unit Cst3 is increased. However, since the second side portion 75 of the second storage electrode 178 of the storage compensation unit Cst2 moves by a distance d4 in the vertical upper direction (e.g., based on the originally predetermined position), the overlapping area between the first storage electrode 155a and the second storage electrode 178 is decreased by area B, and as a result, storage capacitance of the storage compensation unit Cst2 is decreased. As described above, since the storage capacitance is decreased in the storage compensation unit Cst2 by an amount corresponding to the storage capacitance increased in the connection unit Cst3, the storage capacitance is not correspondingly changed.

While this invention has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims and their equivalents.

| Description of some of the reference numerals | |
|---|---|
| 121: Scan line | 122: Previous scan line |
| 123: Light emission control line | |
| 155a: Driving gate electrode | 155b: Switching gate electrode |
| 131a: Driving channel | 131b: Switching channel |
| 140: First insulating layer | 160: Second insulating layer |
| 171: Data line | 172: Driving voltage line |
| 172a: First driving voltage line | 172b: Second driving voltage line |
| 180: Passivation layer | 191: Pixel electrode |
| 192: Initialization voltage line | 270: Common electrode |
| 370: Organic emission layer | |

What is claimed is:

1. An organic light emitting diode display device, comprising:
   a substrate;
   a scan line on the substrate and configured to transfer a scan signal;
   a data line and a driving voltage line crossing the scan line and configured to transfer a data voltage and a driving voltage, respectively;
   a switching transistor connected with the scan line and the data line and comprising a switching drain electrode configured to output the data voltage;
   a driving transistor comprising a driving gate electrode and receiving the data voltage from the switching drain electrode;
   a storage capacitor comprising a first storage electrode formed as one body with the driving gate electrode and a second storage electrode formed as one body with the driving voltage line; and
   an organic light emitting diode electrically connected with a driving drain electrode of the driving transistor,
   wherein:
   the first storage electrode comprises a first side portion, a second side portion, a third side portion, and a fourth side portion;
   the second storage electrode comprises a main portion, a first depressed portion, a second depressed portion, a first protruded portion, a second protruded portion, a third protruded portion, and a fourth protruded portion;

the first side portion and the third side portion of the first
storage electrode face each other;
the second side portion and the fourth side portion of the
first storage electrode face each other;
the first side portion of the first storage electrode overlaps
the first protruded portion, the second protruded portion, and the first depressed portion of the second
storage electrode in a plan view;
the third side portion of the first storage electrode overlaps
the third protruded portion, the fourth protruded portion, and the second depressed portion of the second
storage electrode in the plan view;
the first protruded portion and the second protruded
portion are at respective sides of the first depressed
portion;
the third protruded portion and the fourth protruded
portion are at respective sides of the second depressed
portion;
a storage compensator comprises the third side portion of
the first storage electrode and the second depressed
portion of the second storage electrode; and
a connector comprises the first side portion of the first
storage electrode and the first depressed portion of the
second storage electrode.

2. The organic light emitting diode display device of claim 1, wherein:
the main portion, the second protruded portion, and the
third protruded portion of the second storage electrode
are connected as a first side;
the main portion, the first protruded portion, and the
fourth protruded portion of the second storage electrode
are connected as a second side;
the first side and the second side face each other;
the first side and the second side of the second storage
electrode are disposed outside of and apart from the
second side portion and the fourth side portion of the
first storage electrode in the plan view by a first main
margin width;
the third protruded portion of the second storage electrode
is disposed outside of and apart from the third side
portion of the first storage electrode by a second main
margin width;
the first depressed portion comprises a first inner side
portion;
the second depressed portion comprises a second inner
side portion; and
the second inner side portion of the second depressed
portion of the second storage electrode is disposed
inside and apart from the third side portion of the first
storage electrode by a compensation margin width.

3. The organic light emitting diode display device of claim 2, wherein:
the first main margin width has an added value of a
process margin of edges of the first storage electrode
and a process margin of edges of the second storage
electrode.

4. The organic light emitting diode display device of claim 3, wherein:
the compensation margin width is in a range from a width
smaller 1% of the second main margin width to substantially a same width as the second main margin
width.

5. The organic light emitting diode display device of claim 2, wherein:
the second depressed portion is not disposed with a same
distance from the first side and the second side of the
second storage electrode.

6. The organic light emitting diode display device of claim 1, wherein:
the driving voltage line comprises a first driving voltage
line parallel with the data line and a second driving
voltage line crossing the data line; and
the second storage electrode is an expanded portion of the
second driving voltage line.

7. The organic light emitting diode display device of claim 1, wherein:
the first protruded portion, the second protruded portion,
the third protruded portion, and the fourth protruded
portion of the second storage electrode has a portion
disposed outside of the first side portion and the third
side portion of the first storage electrode in the plan
view.

8. The organic light emitting diode display device of claim 7, wherein:
the first side portion of the first storage electrode, and the
first protruded portion, the second protruded portion,
and the first depressed portion of the second storage
electrode are disposed in an upper part; and
the third side portion of the first storage electrode, and the
third protruded portion, the fourth protruded portion,
and the second depressed portion of the second storage
electrode are disposed in a lower part.

9. The organic light emitting diode display device of claim 1, further comprising:
a semiconductor on the substrate and comprising a
switching channel of the switching transistor and a
driving channel of the driving transistor which are apart
from each other,
wherein the driving channel overlaps with the driving gate
electrode.

10. The organic light emitting diode display device of claim 9, wherein:
the first storage electrode corresponds to the driving gate
electrode, and the second storage electrode is on a same
layer as the data line and the driving voltage line.

11. The organic light emitting diode display device of claim 10, wherein:
the driving channel has at least one curved portion.

12. The organic light emitting diode display device of claim 9, further comprising:
a compensation transistor comprising a compensation
gate electrode which is a part of the scan line, and a
compensation source electrode and a compensation
drain electrode in the semiconductor; and
a first data connector on a same layer as the data line and
connecting the first storage electrode and the compensation drain electrode.

13. The organic light emitting diode display device of claim 12, wherein:
the first data connector is connected with the first storage
electrode at the first side portion of the first storage
electrode disposed outside of the first depressed portion
of the second storage electrode.

14. The organic light emitting diode display device of claim 1, wherein:
the driving voltage line comprises a first driving voltage
line parallel with the data line and a second driving
voltage line crossing the data line; and
the first driving voltage line is at a same layer as the data
line, and the second driving voltage line is at a same
layer as the scan line.

15. The organic light emitting diode display device of claim 1, wherein:

a part of the first protruded portion and a part of the fourth protruded portion of the second storage electrode are respectively extended to and formed as one body with the driving voltage line.

16. The organic light emitting diode display device of claim 2, wherein:
the first depressed portion is not disposed with a same distance from the first side and the second side of the second storage electrode.

* * * * *